US012690316B2

(12) United States Patent (10) Patent No.: US 12,690,316 B2
Shin et al. (45) Date of Patent: Jul. 21, 2026

(54) METHOD OF MAKING A SEMICONDUCTOR PACKAGE WITH GRAPHENE FOR DIE ATTACH

(71) Applicant: STATS ChipPAC Pte. Ltd., Singapore (SG)

(72) Inventors: YongMoo Shin, Incheon (KR); HeeSoo Lee, Incheon (KR); SuJeong Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 260 days.

(21) Appl. No.: 18/351,369

(22) Filed: Jul. 12, 2023

(65) Prior Publication Data

US 2024/0194629 A1 Jun. 13, 2024

Related U.S. Application Data

(63) Continuation-in-part of application No. 18/064,149, filed on Dec. 9, 2022.

(51) Int. Cl.
H10H 20/858 (2025.01)
H10H 20/857 (2025.01)
(Continued)

(52) U.S. Cl.
CPC ...... H10H 20/8581 (2025.01); H10H 20/857 (2025.01); H10H 20/8583 (2025.01);
(Continued)

(58) Field of Classification Search
CPC ..... H01L 25/0652; H01L 25/16; H01L 24/27; H01L 24/29; H01L 24/32; H01L 24/48;
(Continued)

(56) References Cited

U.S. PATENT DOCUMENTS 6,114,413 A * 9/2000 Kang ........................ C08K 9/02
523/210
6,143,116 A 11/2000 Hayashi et al.
(Continued)

FOREIGN PATENT DOCUMENTS

CN 102867793 A 1/2013
CN 102892857 A 1/2013
(Continued)

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. vol. 4, No. 7, Jul. 2014, pp. 1119-1124.
(Continued)

*Primary Examiner* — Khiem D Nguyen
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate with a die pad. A conductive material is disposed on the die pad. The conductive material includes a plurality of graphene-coated metal balls in a matrix. A semiconductor die is disposed on the conductive material. The conductive material is sintered using an infrared laser. A bond wire is formed between the semiconductor die and substrate. An encapsulant is deposited over the semiconductor die and bond wire.

25 Claims, 17 Drawing Sheets

(51) Int. Cl.
| | |
|---|---|
| *H10W 72/00* | (2026.01) |
| *H10W 72/30* | (2026.01) |
| *H10W 90/00* | (2026.01) |
| *H10W 72/90* | (2026.01) |

(52) U.S. Cl.
CPC ......... *H10W 72/322* (2026.01); *H10W 90/00* (2026.01); *H10W 72/01323* (2026.01); *H10W 72/0198* (2026.01); *H10W 72/073* (2026.01); *H10W 72/07331* (2026.01); *H10W 72/07335* (2026.01); *H10W 72/07354* (2026.01); *H10W 72/075* (2026.01); *H10W 72/07531* (2026.01); *H10W 72/07554* (2026.01); *H10W 72/325* (2026.01); *H10W 72/347* (2026.01); *H10W 72/352* (2026.01); *H10W 72/353* (2026.01); *H10W 72/354* (2026.01); *H10W 72/865* (2026.01); *H10W 72/884* (2026.01); *H10W 72/90* (2026.01); *H10W 72/952* (2026.01); *H10W 90/732* (2026.01); *H10W 90/736* (2026.01); *H10W 90/753* (2026.01); *H10W 90/756* (2026.01)

(58) Field of Classification Search
CPC ......... H01L 24/73; H01L 24/83; H01L 24/85; H01L 24/92; H01L 20/0857; H01L 20/8581; H01L 20/8583; H10H 20/857; H10H 20/8581; H10H 20/8583; H10W 90/00; H10W 72/013; H10W 72/01323; H10W 72/865; H10W 72/884; H10W 72/30; H10W 72/851
See application file for complete search history.

(56) References Cited

U.S. PATENT DOCUMENTS

| | | | |
|---|---|---|---|
| 6,297,564 B1 | 10/2001 | Chung | |
| 7,659,145 B2 | 2/2010 | Do et al. | |
| 7,700,943 B2 | 4/2010 | Raravikar et al. | |
| 7,886,813 B2 | 2/2011 | Hua et al. | |
| 7,989,707 B2 | 8/2011 | Yamano et al. | |
| 8,106,495 B2 | 1/2012 | Kajiki | |
| 8,107,242 B2 | 1/2012 | Yoshimoto et al. | |
| 8,263,439 B2 | 9/2012 | Marimuthu et al. | |
| 8,421,232 B2 | 4/2013 | Ikeda et al. | |
| 8,535,553 B2 | 9/2013 | Kong et al. | |
| 8,623,753 B1 | 1/2014 | Yoshida et al. | |
| 8,643,185 B2 | 2/2014 | Kajiwara et al. | |
| 8,710,649 B1 | 4/2014 | Huemoeller et al. | |
| 8,927,334 B2 | 1/2015 | Daubenspeck et al. | |
| 9,070,677 B2 | 6/2015 | Park | |
| 9,105,613 B1 | 8/2015 | Chen et al. | |
| 9,144,183 B2 | 9/2015 | Chen et al. | |
| 9,202,742 B1 | 12/2015 | Kim et al. | |
| 9,305,854 B2 | 4/2016 | Shim et al. | |
| 9,337,073 B2 | 5/2016 | Liu et al. | |
| 9,406,533 B2 | 8/2016 | Chi et al. | |
| 9,576,922 B2* | 2/2017 | Brunschwiler .... B23K 35/0244 | |
| 9,698,075 B2 | 7/2017 | Venugopal et al. | |
| 9,780,071 B2 | 10/2017 | Lee et al. | |
| 9,859,200 B2 | 1/2018 | Park et al. | |
| 9,916,989 B2 | 3/2018 | Yoon et al. | |
| 10,287,471 B2 | 5/2019 | Zhang et al. | |
| 10,322,472 B2 | 6/2019 | Hattori et al. | |
| 10,340,154 B2 | 7/2019 | Kamikoriyama et al. | |
| 10,421,123 B2 | 9/2019 | Jeong et al. | |
| 10,510,733 B2 | 12/2019 | Kumar et al. | |
| 10,566,104 B2 | 2/2020 | Lee et al. | |
| 10,600,743 B2 | 3/2020 | Lee et al. | |
| 10,784,181 B2* | 9/2020 | Fu ...................... H01L 21/4871 | |
| 10,854,549 B2 | 12/2020 | Nakano | |
| 10,867,936 B2 | 12/2020 | Wang et al. | |
| 10,872,879 B2 | 12/2020 | Kim et al. | |
| 11,437,308 B2 | 9/2022 | Rho et al. | |
| 11,652,060 B2 | 5/2023 | Gomes et al. | |
| 11,810,844 B2 | 11/2023 | Mok | |
| 12,388,029 B2 | 8/2025 | Yim et al. | |
| 2002/0104669 A1 | 8/2002 | Underwood et al. | |
| 2006/0007661 A1 | 1/2006 | Iketaki | |
| 2008/0038871 A1 | 2/2008 | Chiu et al. | |
| 2009/0096100 A1* | 4/2009 | Kajiwara ................ H01L 24/29 | |
| | | | 252/512 |
| 2009/0152715 A1 | 6/2009 | Shim et al. | |
| 2010/0109688 A1 | 5/2010 | Eldridge et al. | |
| 2010/0129648 A1 | 5/2010 | Xu et al. | |
| 2011/0006425 A1 | 1/2011 | Wada et al. | |
| 2012/0018897 A1 | 1/2012 | Park et al. | |
| 2012/0056329 A1 | 3/2012 | Pagaila et al. | |
| 2012/0132930 A1 | 5/2012 | Young et al. | |
| 2013/0056703 A1* | 3/2013 | Elian .................... G01N 27/127 | |
| | | | 977/734 |
| 2013/0063898 A1 | 3/2013 | Schuett et al. | |
| 2013/0075923 A1 | 3/2013 | Park et al. | |
| 2013/0082298 A1* | 4/2013 | Golle .................. H01L 25/0753 | |
| | | | 438/22 |
| 2013/0082364 A1 | 4/2013 | Wang et al. | |
| 2013/0134361 A1 | 5/2013 | Lee et al. | |
| 2014/0024211 A1 | 1/2014 | Ott et al. | |
| 2014/0103527 A1 | 4/2014 | Mariumuthu et al. | |
| 2015/0179602 A1 | 6/2015 | Camacho et al. | |
| 2015/0287491 A1 | 10/2015 | Suh et al. | |
| 2016/0039662 A1 | 2/2016 | Lin et al. | |
| 2016/0137507 A1 | 5/2016 | You et al. | |
| 2016/0286698 A1 | 9/2016 | Chang et al. | |
| 2016/0300777 A1 | 10/2016 | Hong et al. | |
| 2017/0033086 A1 | 2/2017 | Homma et al. | |
| 2017/0130034 A1 | 5/2017 | Hwang et al. | |
| 2017/0167716 A1 | 6/2017 | Ezaki et al. | |
| 2018/0133794 A1 | 5/2018 | Jeong et al. | |
| 2018/0190593 A1 | 7/2018 | Gaines et al. | |
| 2018/0323170 A1 | 11/2018 | Kim et al. | |
| 2018/0346679 A1 | 12/2018 | Shishkin et al. | |
| 2019/0139902 A1 | 5/2019 | Lee et al. | |
| 2019/0181082 A1 | 6/2019 | Chen et al. | |
| 2019/0206839 A1 | 7/2019 | Balakrishnan et al. | |
| 2019/0259685 A1* | 8/2019 | Hussain ................ H05K 1/181 | |
| 2019/0348344 A1 | 11/2019 | Lu et al. | |
| 2019/0382627 A1 | 12/2019 | Hu et al. | |
| 2019/0394898 A1 | 12/2019 | Manninen et al. | |
| 2020/0002176 A1 | 1/2020 | Gorton | |
| 2020/0075502 A1 | 3/2020 | Kim et al. | |
| 2020/0161252 A1 | 5/2020 | Yang et al. | |
| 2020/0227338 A1 | 7/2020 | Gong | |
| 2020/0388552 A1 | 12/2020 | Chou et al. | |
| 2021/0005512 A1 | 1/2021 | Liu et al. | |
| 2021/0028122 A1 | 1/2021 | Son et al. | |
| 2021/0151357 A1* | 5/2021 | Cook .................... H01L 23/295 | |
| 2021/0257346 A1 | 8/2021 | Baloglu et al. | |
| 2022/0002157 A1 | 1/2022 | Corrigan et al. | |
| 2022/0066703 A1 | 3/2022 | Hayes | |
| 2022/0352398 A1 | 11/2022 | Munshi et al. | |
| 2022/0359418 A1 | 11/2022 | Jung et al. | |
| 2023/0320106 A1 | 10/2023 | Mun | |
| 2023/0323067 A1 | 10/2023 | Yoshida et al. | |
| 2024/0096736 A1* | 3/2024 | Shin ...................... H10W 40/25 | |
| 2024/0128200 A1 | 4/2024 | Shin et al. | |
| 2024/0153783 A1 | 5/2024 | Lee et al. | |

FOREIGN PATENT DOCUMENTS

| | | |
|---|---|---|
| CN | 106158790 A | 11/2016 |
| CN | 110071074 A | 7/2019 |
| CN | 111625149 A | 9/2020 |
| JP | H10335526 A | 12/1998 |
| KR | 10-1465616 B1 | 11/2014 |
| KR | 20150142090 A | 12/2015 |
| KR | 10-1895114 B1 | 8/2018 |
| KR | 10-2395247 B1 | 5/2022 |
| TW | 202134169 A | 9/2021 |
| WO | 2022113729 A1 | 6/2022 |

(56)        References Cited

FOREIGN PATENT DOCUMENTS

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.

* cited by examiner

METHOD OF MAKING A SEMICONDUCTOR PACKAGE WITH GRAPHENE FOR DIE ATTACH

CLAIM OF DOMESTIC PRIORITY

The present application is a continuation-in-part of U.S. patent application Ser. No. 18/064,149, filed Dec. 9, 2022, which application is incorporated herein by reference.

FIELD OF THE INVENTION

The present invention relates in general to semiconductor devices and, more particularly, to a semiconductor device and method of making a semiconductor package with graphene for die attach.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices, particularly in high power applications, often contain one or more semiconductor die or integrated passive devices (IPDs) to perform necessary electrical functions. The semiconductor die may contain power devices, such as a power transistor, capable of conducting large currents at high voltages in high stress environments. One or more semiconductor die and/or IPDs can be mounted to a leadframe or other substrate for structural support and electrical interconnect. An encapsulant is deposited over the semiconductor die, IPDs, and leadframe to form a semiconductor package, such as quad flat no-lead (QFN).

The semiconductor die and/or IPD must be bonded to the leadframe with sufficient strength to maintain physical integrity of the package over normal operating conditions, e.g., large current, high voltage, high frequency, and high stress environments, as found in power applications. Power applications can be robots, solar cells, Internet of Things (IoT), aerosols, and automotive, including electric vehicles. The semiconductor die may perform voltage conversion and wavenumber change. High stress involves high temperature, vibration, and physical shock. Given the extreme operating environment, the bonding material, e.g., Ag epoxy, between the semiconductor die and leadframe must have high reliability for the thermal and physical conditions of the semiconductor device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the semiconductor package. The electrical connections can be made with conductive layers, bumps, stud bumps, conductive paste, or wirebonds. An encapsulant or other molding material is deposited over the semiconductor package to provide physical support and electrical isolation. The finished semiconductor package is then inserted into an electrical system and the functionality of the semiconductor device is made available to the other system components.

Figure 1A:
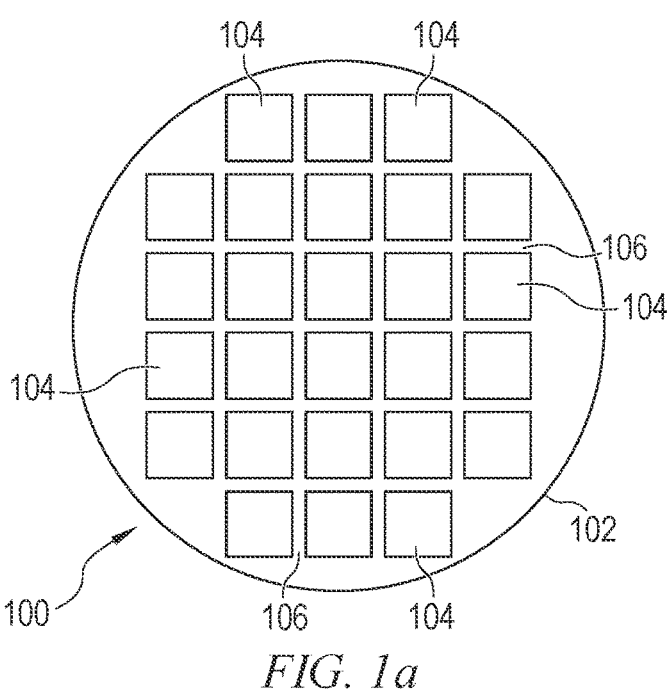
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
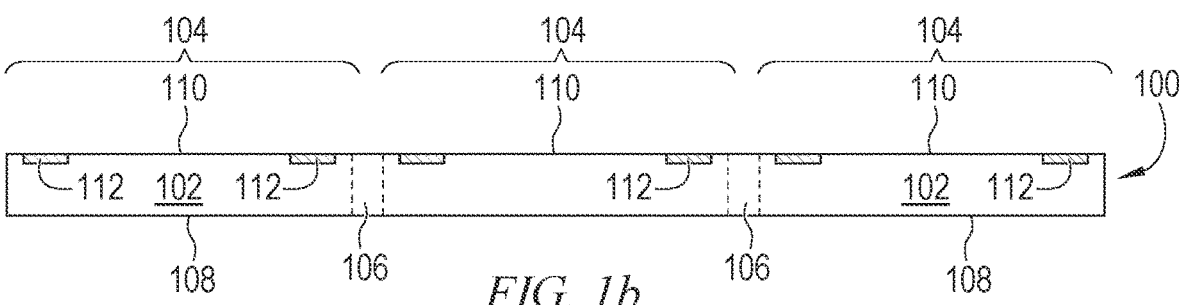

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed over or within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, power devices, or other signal processing circuit. Semiconductor die 104 may also contain IPDs, such as inductors, capacitors, and resistors, for RF signal processing. In some embodiments, semiconductor die 104 is a light-reactive device. Active surface 110 can have a light-emitting diode (LED) formed thereon to emit light or be photosensitive by including a photodiode or phototransistor.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
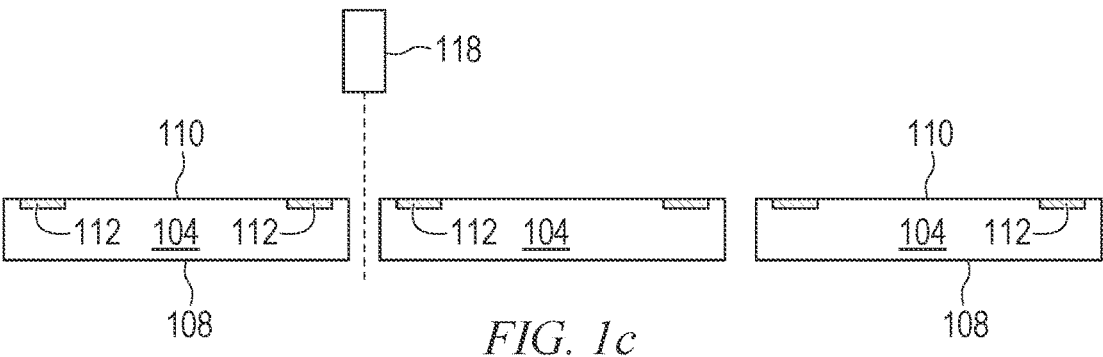

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) or known good unit (KGU) after singulation.

Figures 2A, 2B, 2C:
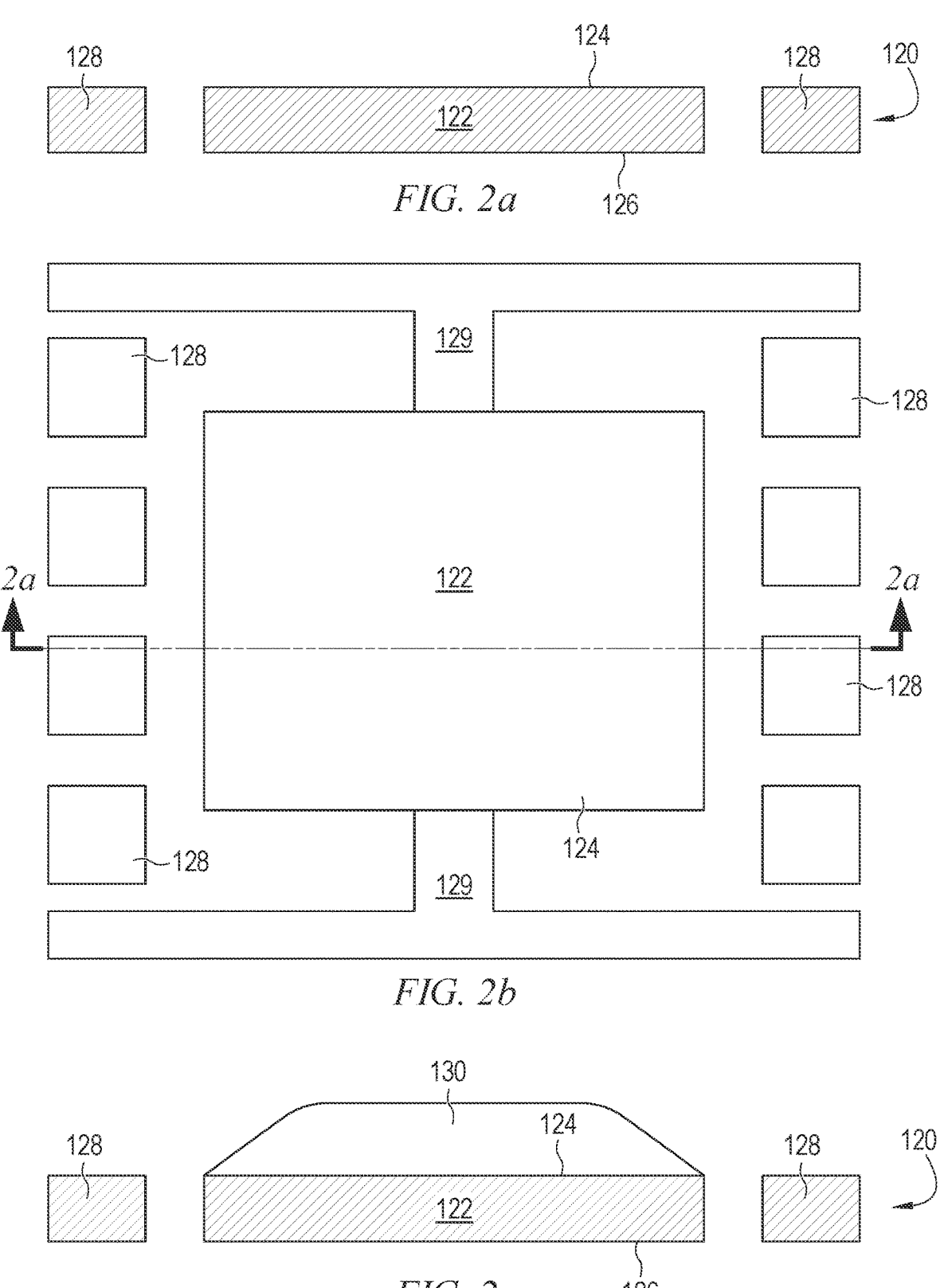
FIGS. 2a-2g illustrate a process of forming a semiconductor package.

FIGS. 2a-2g illustrate a process of using graphene core shells within an adhesive layer for die attach in a semiconductor package. FIG. 2a shows a cross-sectional view of substrate 120. In one embodiment, substrate 120 is a leadframe with flag or die mounting site 122 having a top surface 124 and bottom surface 126 opposite the top surface. Pads 128 are located around flag 122. The leadframe embodiment of substrate 120 is part of a quad flat no-lead (QFN) type semiconductor package, useful in power applications, such as robots, solar cells, IoT, aerosols, and automotive, including electric vehicles. FIG. 2b is a top view of substrate 120 showing flag 122 and pads 128 interconnected by support bar 129 constituting the leadframe. Alternatively, substrate 120 can be a semiconductor wafer or panel substrate with a base substrate material, such as silicon, germanium, aluminum phosphide, aluminum arsenide, gallium arsenide, gallium nitride, indium phosphide, or silicon carbide for structural support.

In FIG. 2c, graphene-filler adhesive layer 130 is deposited on surface 124 of flag 122 of substrate 120. Graphene-filler adhesive layer 130 is discussed infra.

Figure 2D:
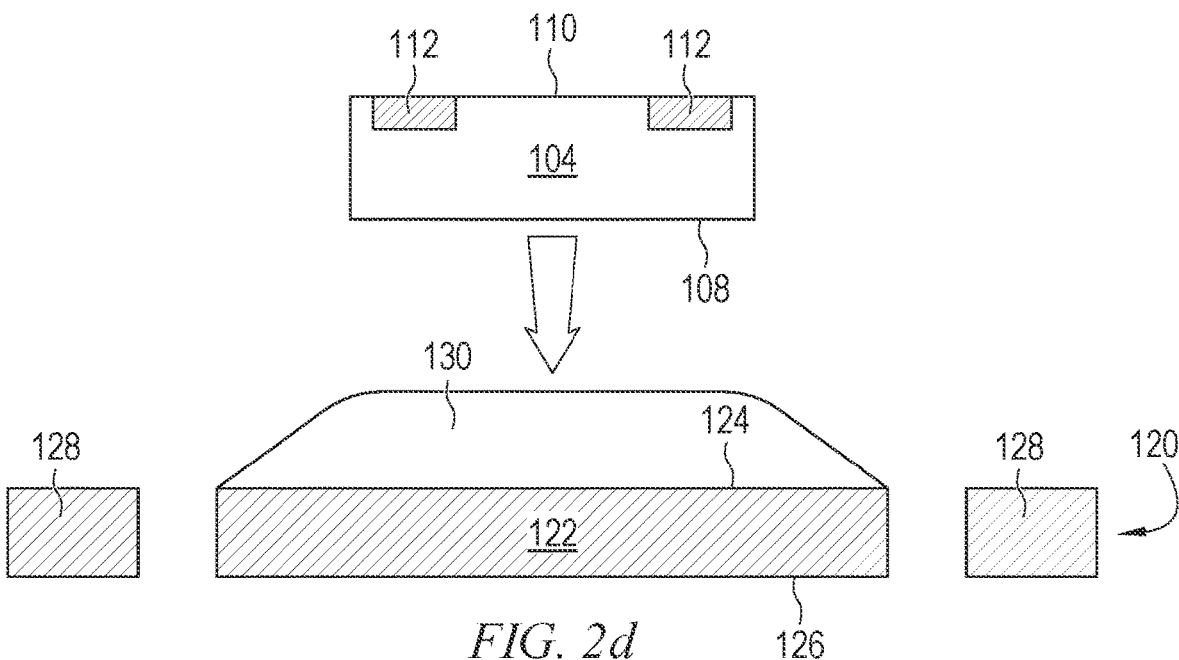
Figure 2E:
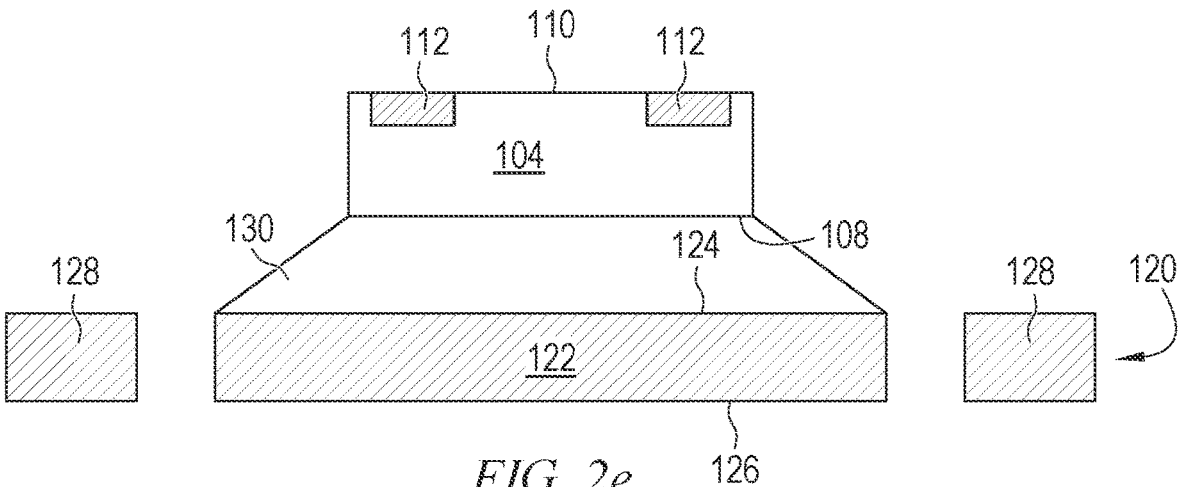

In FIG. 2d, semiconductor die 104 from FIG. 1c is disposed over adhesive layer 130 using a pick and place operation. Leading with back surface 108, semiconductor die 104 is brought into contact with graphene-filler adhesive layer 130. Adhesive layer 130 is cured to secure semiconductor die 104 to flag 122, as shown in FIG. 2e.

Figure 2F:
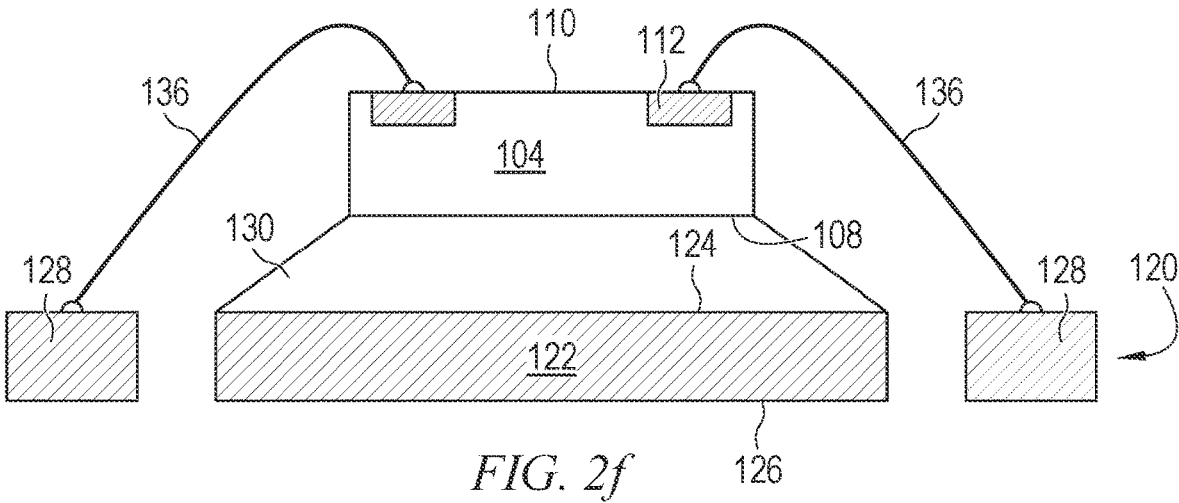

In FIG. 2f, bond wires 136 are placed between conductive layer 112 on semiconductor die 104 and pads 128 of leadframe substrate 120. Each end of bond wires 136 is reflowed to make mechanical and electrical connection between conductive layer 112 and pads 128.

Figure 2G:
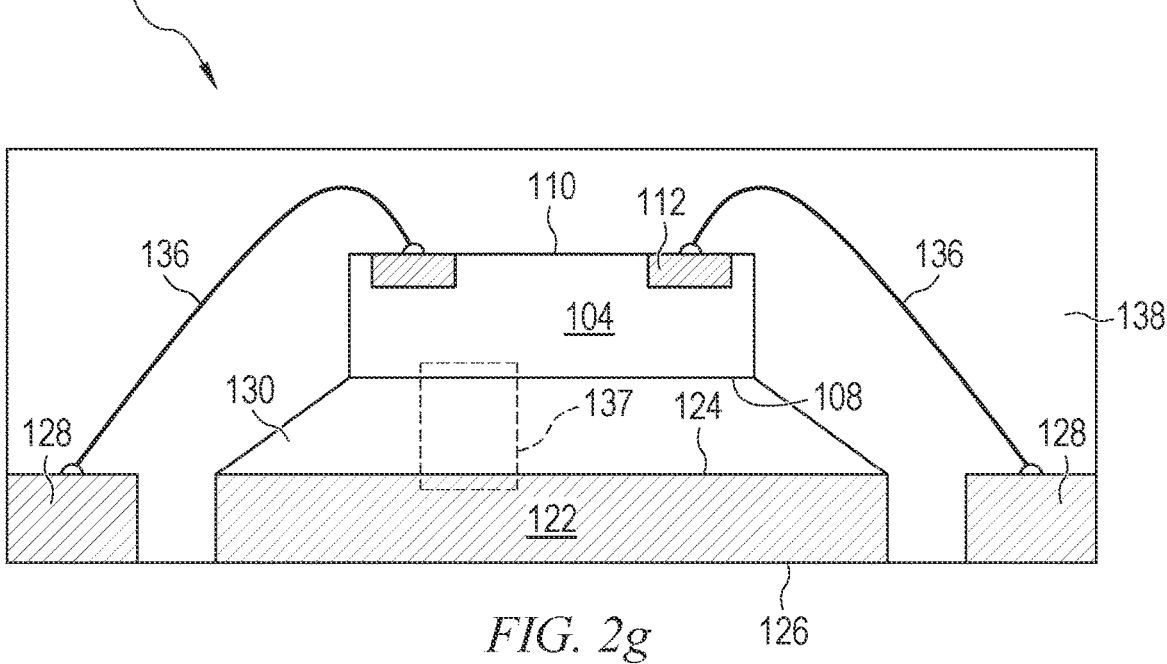

In FIG. 2g, encapsulant or molding compound 138 is deposited over and around semiconductor die 104 and substrate 120 using a paste printing, compressive molding, transfer molding, liquid encapsulant molding, vacuum lamination, spin coating, or other suitable applicator. Encapsulant 138 can be liquid or granular polymer composite material, such as epoxy resin with filler, epoxy acrylate with filler, or polymer with proper filler. Encapsulant 138 is non-conductive, provides structural support, and environmentally protects the semiconductor device from external elements and contaminants.

Support segments 129 are severed leaving pads 128 electrically isolated from each other. The combination of substrate 120, semiconductor die 104, and encapsulant 138 constitutes semiconductor package 139.

Figure 3:
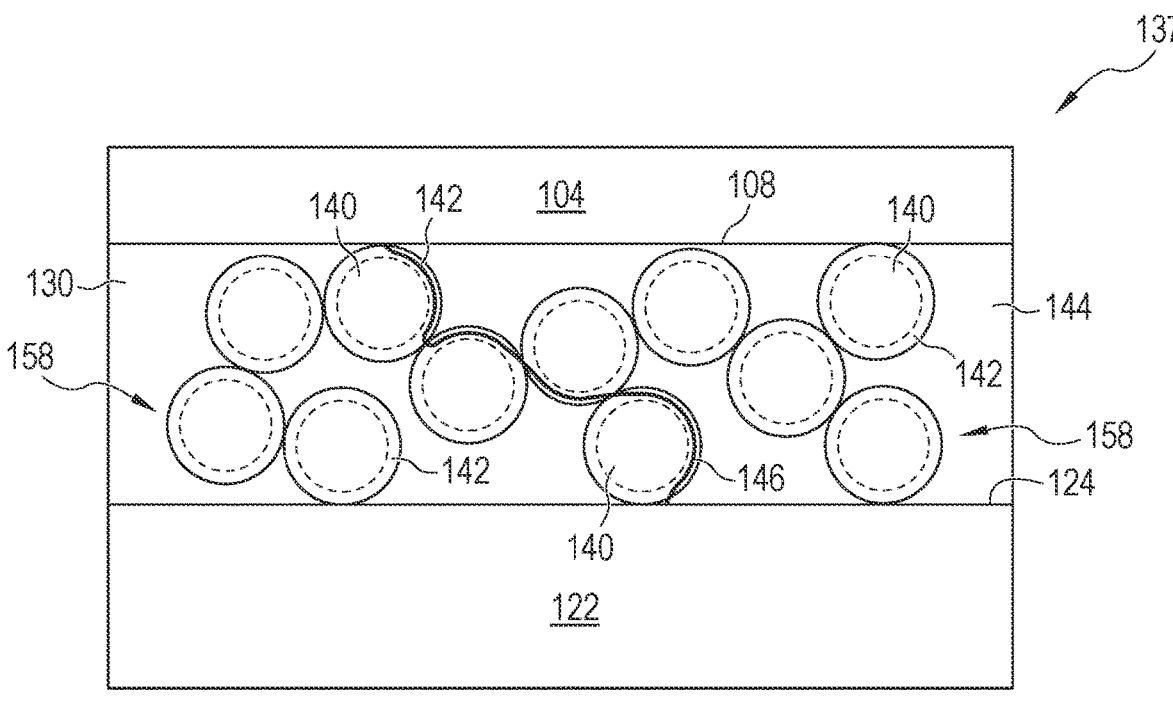
FIG. 3 illustrates an adhesive layer containing graphene core shells within a matrix.

FIG. 3 shows further detail of region or box 137 from FIG. 2g. In one embodiment, adhesive layer 130 includes a plurality of cores 140 with graphene coating 142 embedded within matrix 144, as shown in FIG. 3. Matrix 144 can be a thermoset material, such as epoxy resin or adhesive with binder and filler containing silicon, alumina, Al, aluminum zinc oxide, or other material having good adhesive and thermal properties. Matrix 144 can be thermal grease such as silicon or polymer type such as polymethyl methacrylate (PMMA) or polyethylene terephthalate (PET). Core 140 can be Cu, Ni, phase change material (PCM), or other suitable metal or similar material. Cores 140 are arranged within matrix 144 so that most if not all graphene coatings 142 covering the core contact at least one adjacent graphene coating to form a continuous and connecting path 146 of graphene coatings between top surface 124 of leadframe flag 122 and surface 108 of semiconductor die 104. A first graphene coating 142 contacts a second adjacent graphene coating, which in turn contacts a third adjacent graphene coating, and so on, to form continuous and connecting path 146. Cores 140 have sufficient density that most if not all the graphene coatings around the cores contact at least one graphene coating around an adjacent core, and typically contact graphene coating of multiple adjacent cores. In one embodiment, continuous and connecting path 146 is a thermal path to dissipate heat away from semiconductor package 139.

Figure 4:
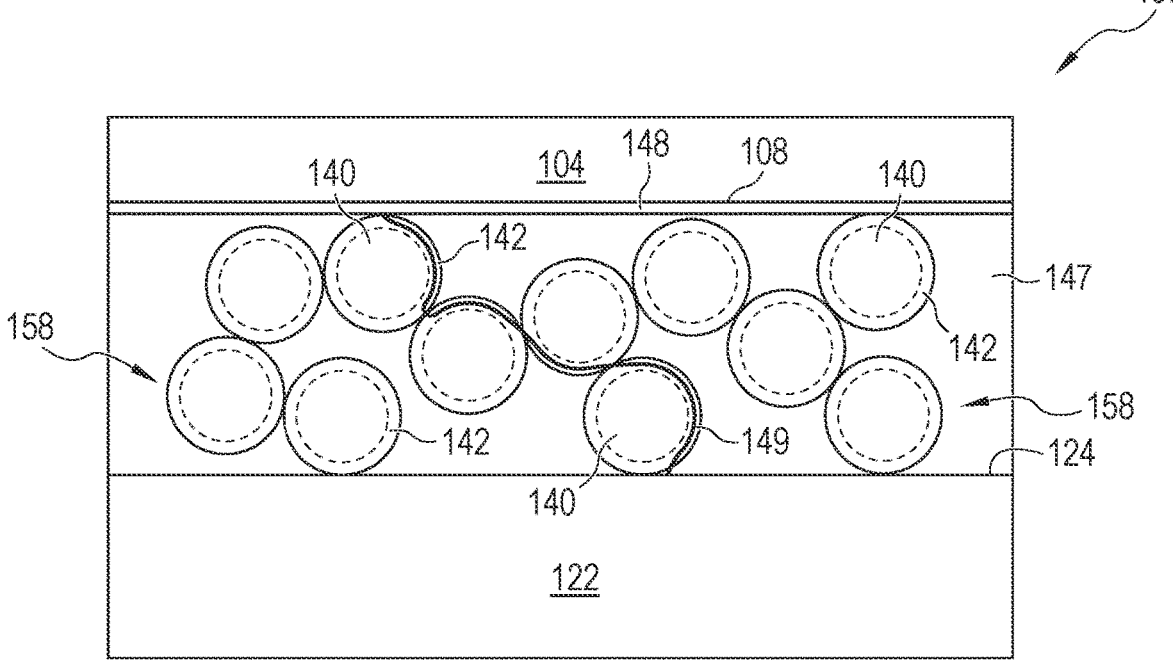
FIG. 4 illustrates another embodiment of the adhesive layer containing graphene core shells within a matrix.

In another embodiment, FIG. 4 shows further detail of region or box 137 from FIG. 2g. In this case, matrix 147 is solder containing one or more elements of Sn, lead (Pb), or indium (In). Again, core 140 can be Cu, Ni, PCM, or other suitable metal or similar material. Each core 140, as embedded in matrix 144 or 147, is surrounded or covered by graphene coating or shell 142. In one embodiment, a graphene paste or ink is formed around a Cu core as graphene core shell 158. An adhesive layer 148, such as Cu/SuS, titanium (Ti), or Ag, is formed over matrix 147 to contact surface 108 of semiconductor die 104.

Cores 140 are arranged within matrix 147 so that most if not all graphene coatings 142 covering the core contact at least one adjacent graphene coating to form a continuous and connecting path 149 of graphene coatings between top surface 124 of leadframe flag 122 and adhesive layer 148 at surface 108 of semiconductor die 104. Graphene coating 142 of each core 140 contacts the graphene coating of an adjacent core. A first graphene coating 142 contacts a second adjacent graphene coating, which in turn contacts a third adjacent graphene coating, and so on, to form continuous and connecting path 149. Cores 140 have sufficient density that most if not all the graphene coatings around the cores contact at least one graphene coating around an adjacent core, and typically contact graphene coating of multiple adjacent cores.

Figures 5A, 5B, 5C:
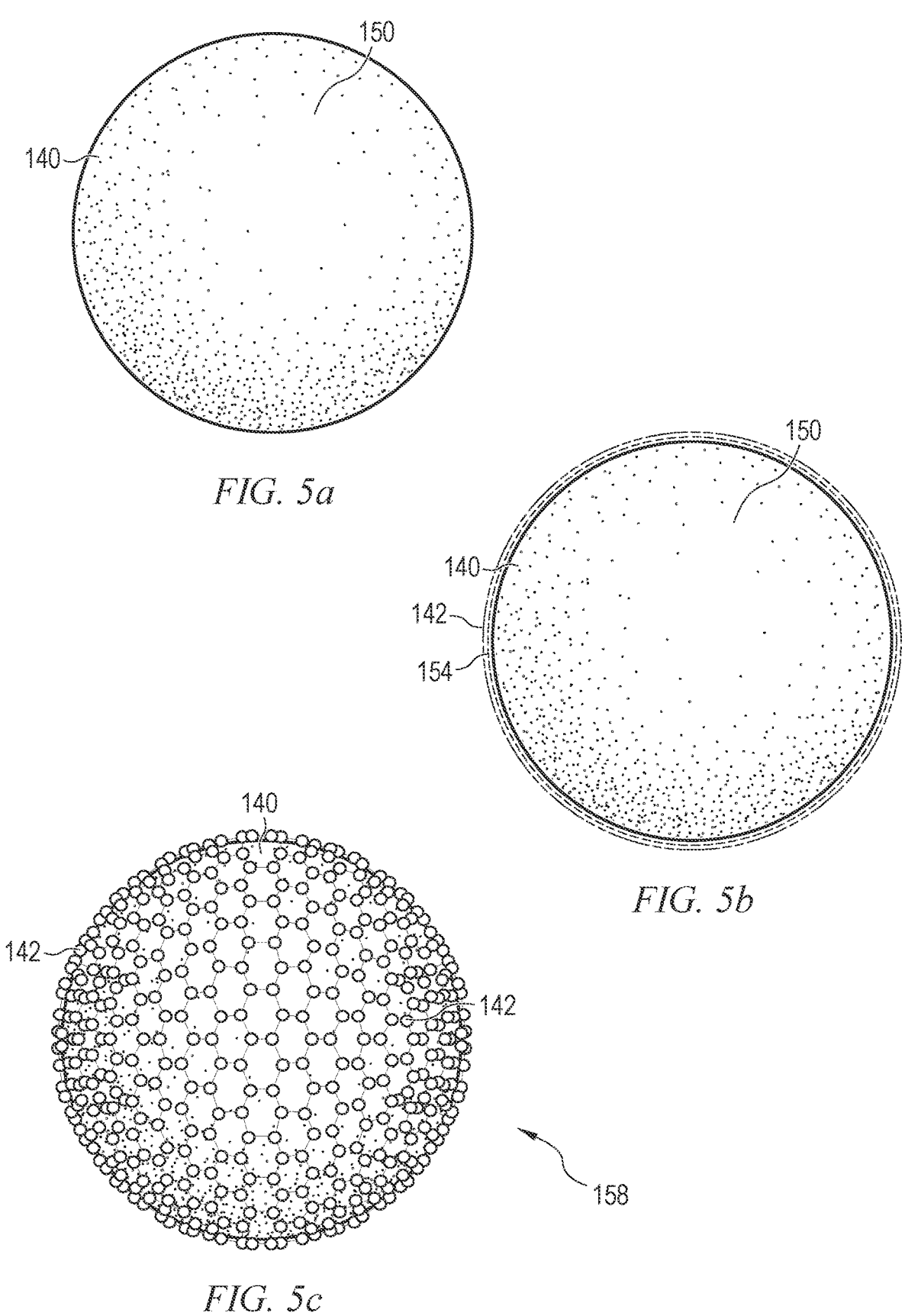
FIGS. 5a-5c illustrate a process of forming a graphene core shell.

FIGS. 5a-5c illustrate further detail of core 140, graphene coating 142, and graphene core shell 158. In one embodiment, core 140 is Cu, Ni, PCM, or other suitable metal or similar material. FIG. 5b illustrates graphene coating 142 formed over and around surface 150 of core 140. FIG. 5c illustrates further detail of graphene coating 142 formed as a mesh network around surface 150 of core 140, collectively graphene core shell 158. Graphene 142 is an allotrope of carbon with one or more layers of carbon atoms each arranged in a two-dimensional (2D) honeycomb lattice. Graphene coating 142 can be formed by CVD. Core 140 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 142 on surface 150 of core 140. The release of carbon atoms over core 140 forms a continuous sheet of graphene coating 142. Additional information related to forming graphene coating by CVD is disclosed in U.S. Pat. No. 8,535,553, and hereby incorporated by reference.

Core 140 is PCM capable of phase change from solid to liquid phase or from liquid phase to solid phase within the operating temperature range of the semiconductor chip, e.g., 20-200° C. A first coating 154 is formed around PCM core 140, as shown in FIG. 5b, and discussed in published Korean application KR101465616B1. The first coating 154 can be a polymer intermediate layer. A second coating 142 is formed over the first coating 154. Matrix 144, 147 with graphene covered cores is further disclosed in U.S. Pat. No. 10/421, 123, and all are incorporated herein by reference.

The properties of graphene are summarized in Table 1, as follows:

TABLE 1

Properties of graphene

| Parameter | |
| --- | --- |
| Electronic mobility | $2 \times 10^5$ cm$^2$ V$^{-1}$ s$^{-1}$ |
| Current density | $10^9$ A cm$^{-1}$ |
| Velocity of fermion (electron) | $10^6$ m s$^{-1}$ |
| Thermal conductivity | 4000-5000 W m$^{-1}$ K$^{-1}$ |
| Tensile strength | 1.5 Tpa |
| Breaking strength | 42 N m$^{-1}$ |
| Transparency | 97.7% |
| Elastic limit | 20% |
| Surface area | 2360 m$^2$ g$^{-1}$ |

Graphene 142 has ten times the electrical conductivity of Cu. Graphene 142 enables epoxy to exhibit electrical conductivity similar to Ag, while reducing or eliminating oxidation. Core shell 158 with Cu and graphene epoxy is low cost, as compared to sputtering. Graphene 142 has a low moisture permeability and a high thermal conductivity of 4000-5000 W m$^{-1}$ K$^{-1}$, 10 times higher than Cu at room temperature. Since carbon also has a good solderability and wettability of solder paste, adhesive layer 130 can be readily formed. Graphene 142 exhibits a high degree of flexibility and remains stable against warpage. Adhesive layer 130 with graphene Cu shells 158 improves die attach properties and electrical conductivity, while lowering manufacturing cost.

Figure 6:
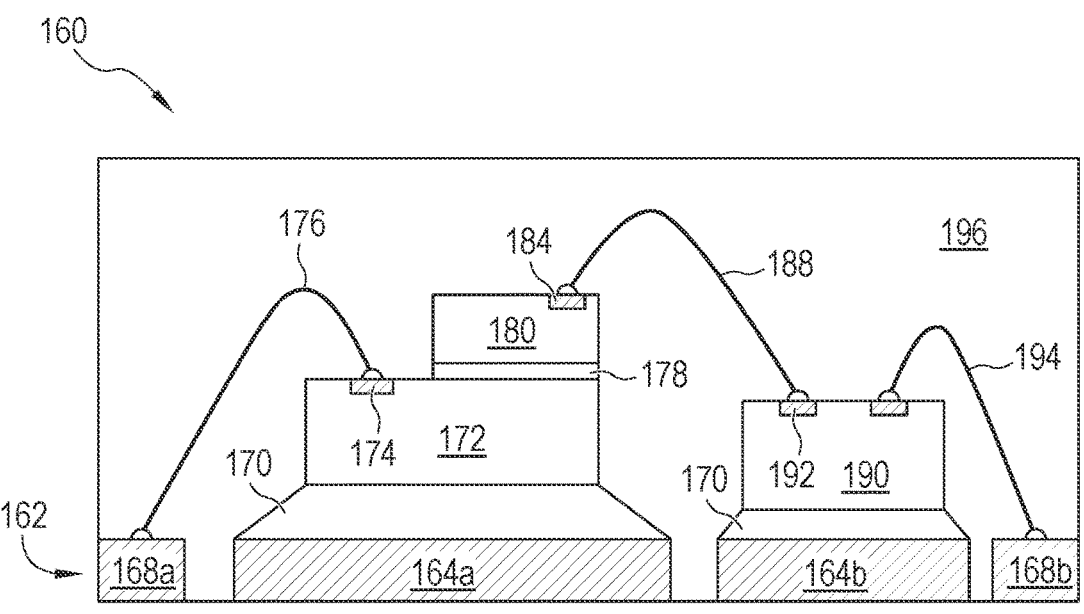
FIG. 6 illustrates another semiconductor package using the adhesive layer containing graphene core shells within a matrix.

In another embodiment, semiconductor package 160 uses leadframe substrate 162 with flags 164a and 164 and pads 168a and 168b, similar to leadframe substrate 120 but with multiple flags for mounting multiple semiconductor die, as shown in FIG. 6. Adhesive layer 170 is deposited over flags 164a and 164b, similar to FIG. 2c. Adhesive layer 170 is similar to adhesive layer 130, containing a matrix and core shells, as described in FIGS. 3-5. Semiconductor die 172 is affixed to adhesive layer 170 over flag 164a, similar to FIGS. 2d-2e. Conductive layer 174, connected to the active surface of semiconductor die 170, is coupled to pad 168a with wire bond 176. Semiconductor die 180 is affixed to adhesive layer 178 over the active surface of semiconductor die 172, similar to FIGS. 2d-2e. Adhesive layer 178 can be similar to adhesive layer 130, containing a matrix and core shells, as described in FIGS. 3-5. Adhesive layer 178 can be other types of adhesive material, such as epoxy resin. Each end of bond wires 176 is reflowed to make mechanical and electrical connection between conductive layer 174 and pads 168a. Semiconductor die 172, 180, and 190 can be made similar to the wafer from FIGS. 1a-1c, although with a different form and function.

Semiconductor die 190 is affixed to adhesive layer 170 over flag 164b, similar to FIGS. 2d-2e. Conductive layer 192, connected to the active surface of semiconductor die 190, is coupled to pad 168b with wire bond 194. Conductive layer 184, connected to the active surface of semiconductor die 180, is coupled to conductive layer 192 on semiconductor die 190 with wire bond 188. Each end of bond wires 188 and 194 is reflowed to make mechanical and electrical connection between semiconductor die 180 and 190 and leadframe substrate 162. Adhesive layer 170 with matrix and graphene core shells provides improved die attach properties for semiconductor die 172 and 190, as described for adhesive layer 130 in FIGS. 3-5.

An encapsulant or molding compound 196 is deposited over and around semiconductor die 170, 180, and 190 and leadframe substrate 162 using a paste printing, compressive molding, transfer molding, liquid encapsulant molding, vacuum lamination, spin coating, or other suitable applicator. Encapsulant 196 can be liquid or granular polymer composite material, such as epoxy resin with filler, epoxy acrylate with filler, or polymer with proper filler. Encapsulant 196 is non-conductive, provides structural support, and environmentally protects the semiconductor device from external elements and contaminants.

Figure 7:
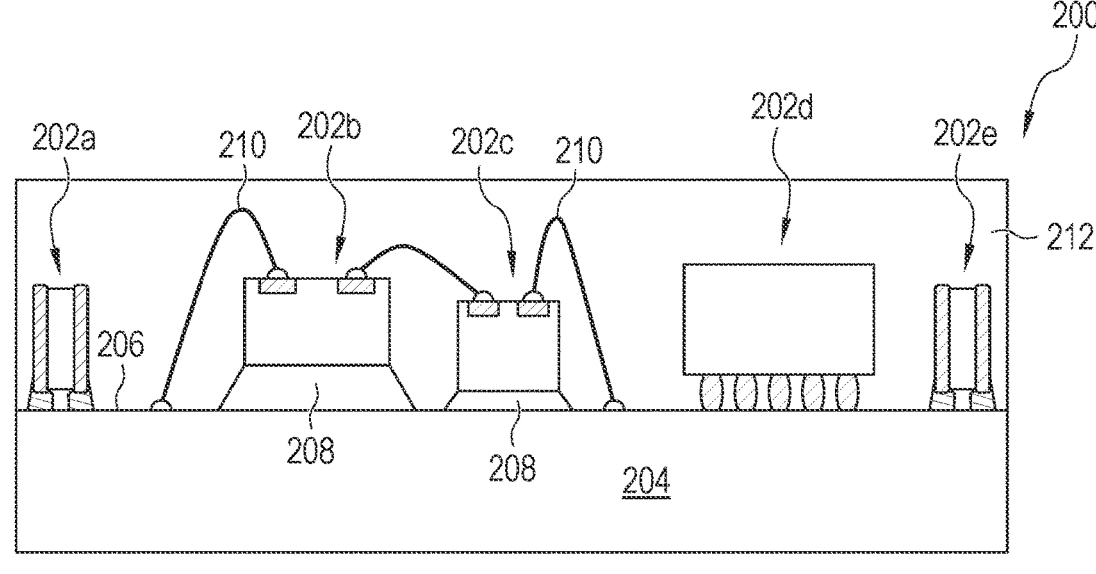
FIG. 7 illustrates yet another semiconductor package using the adhesive layer containing graphene core shells within a matrix.

In another embodiment, semiconductor package 200 uses substrate 204 with a base substrate material, such as silicon, germanium, aluminum phosphide, aluminum arsenide, gallium arsenide, gallium nitride, indium phosphide, silicon carbide for structural support, as shown in FIG. 7. Adhesive layer 208 is deposited over surface 206 of substrate 204, similar to FIG. 2c. Adhesive layer 208 is similar die attach features as adhesive layer 130, containing a matrix and core shells, as described in FIGS. 3-5.

Electrical components 202a-202e are disposed on surface 206 of substrate 204. In particular, electrical components 202*b* and 202*c* are disposed on surface 206 using adhesive layer 208, similar to FIGS. 2*d*-2*e*. Electrical components 202*b*-202*d* can be similar to semiconductor die 104 from FIG. 1*c*, although with a different form and function. Electrical component 202*a* and 202*e* can be discrete electrical devices, or IPDs, such as a diode, transistor, resistor, capacitor, and inductor. Alternatively, electrical components 202*a*-202*e* can include other semiconductor die, semiconductor packages, surface mount devices, RF components, discrete electrical devices, or integrated passive devices (IPD). Adhesive layer 208 with matrix and graphene core shells provides improved die attach properties for electrical components 202*b* and 202*c*, as described for adhesive layer 130 in FIGS. 3-5.

Bond wires 210 electrically connect electrical components 202*b* and 202*c* to substrate 204. An encapsulant or molding compound 212 is deposited over and around electrical components 202*a*-202*e* and substrate 204 using a paste printing, compressive molding, transfer molding, liquid encapsulant molding, vacuum lamination, spin coating, or other suitable applicator. Encapsulant 212 can be liquid or granular polymer composite material, such as epoxy resin with filler, epoxy acrylate with filler, or polymer with proper filler. Encapsulant 212 is non-conductive, provides structural support, and environmentally protects the semiconductor device from external elements and contaminants.

Figure 8A:
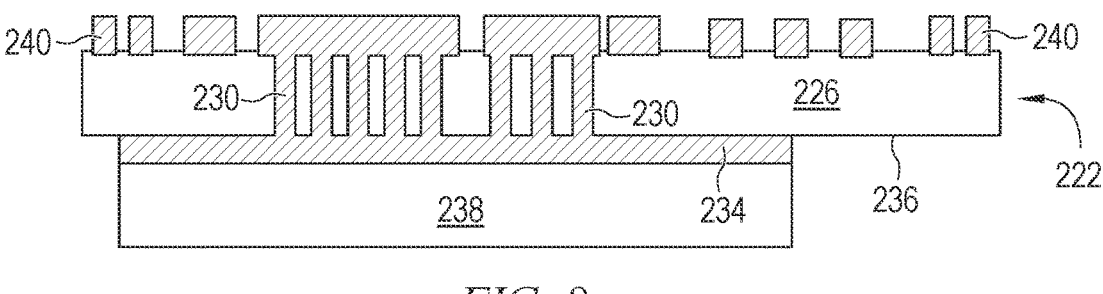
FIGS. 8a-8c illustrate yet another semiconductor package using the adhesive layer containing graphene core shells within a matrix.

In another embodiment, substrate 222 contains base substrate material 226, such as silicon, germanium, aluminum phosphide, aluminum arsenide, gallium arsenide, gallium nitride, indium phosphide, or silicon carbide for structural support, as shown in FIG. 8*a*. In one embodiment, substrate 222 is a PCB. Conductive vias 230 are formed through base substrate material 226. Conductive layer 234 is formed over surface 236 of substrate 222 and electrically and thermally connected to conductive vias 230. Heat sink 238 is formed over conductive layer 234 to provide heat dissipation from the package. Heat sink 238 can be one or more layers of Al, Cu, Sn, Ni, Au, Ag, or other suitable thermally conductive material to dissipate heat generated by electrical components 244*a*-244*e*. Conductive layer 240 is formed over surface 242 of substrate 222 and electrically and thermally connected to conductive vias 230.

Figure 8B:
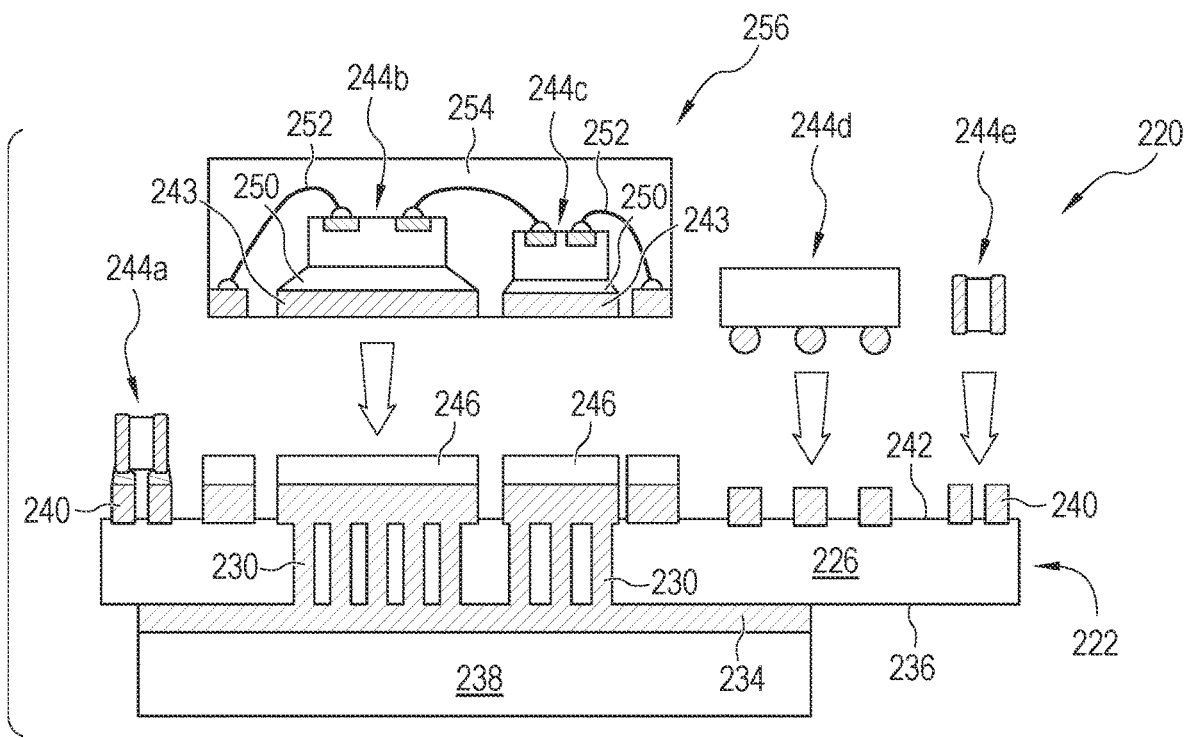

In FIG. 8*b*, leadframe module 256 is formed with leadframe substrate 243 including flags and pads. Electrical components 244*b* and 244*c* are affixed to the flags of leadframe substrate 243 with adhesive layer 250. Adhesive layer 250 is made similar to adhesive layer 130, containing a matrix and core shells, as described in FIGS. 3-5. Bond wires 252 electrically connect electrical components 244*b* and 244*c* to the pads of leadframe substrate 243. Encapsulant 254 is deposited over electrical components 244*b* and 244*c*, bond wires 252, and leadframe substrate 243, providing leadframe module 256, similar to FIGS. 2*a*-2*e*.

An adhesive layer 246 is deposited over conductive layer 240. Adhesive layer 246 is made similar to adhesive layer 130, containing a matrix and core shells, as described in FIGS. 3-5. Electrical components 244*a*-244*e* are positioned over surface 242 of substrate 222 using a pick and place operation, with electrical components 244*b* and 244*c* being part of leadframe module 256. Electrical components 244*a*, 244*d*, and 244*e* are then reflowed to affix to conductive layer 240 on substrate 222. Electrical components 244*a*, 244*d*, and 244*e* are individual semiconductor die or discrete devices. Electrical components 244*b* and 244*c*, being part of leadframe module 256, are affixed to conductive layer 240 with adhesive layer 246. Electrical components 244*b*, 244*c*, and 244*d* can be similar to semiconductor die 104 from FIG.

Figure 8C:
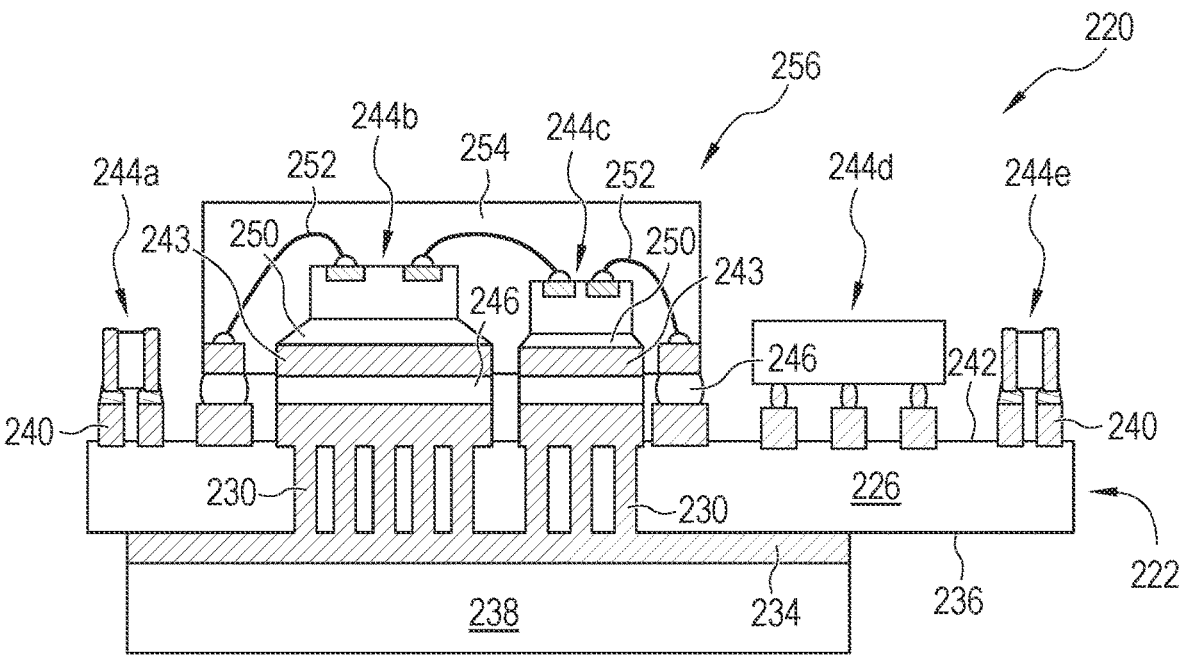

1*c*, although with a different form and function. Electrical component 244*a* and 244*e* can be discrete electrical devices, or IPDs, such as a diode, transistor, resistor, capacitor, and inductor. Alternatively, electrical components 244*a*-244*e* can include other semiconductor die, semiconductor packages, surface mount devices, RF components, discrete electrical devices, or IPD. FIG. 8*c* shows electrical components 244*a*-244*e* (with electrical components 244*b* and 244*c* being part of leadframe module 256) mounted to substrate 222 as semiconductor package 220.

Adhesive layers 246 and 250 with matrix and graphene core shells provide improved die attach properties for electrical components 244*b* and 244*c* and substrate 243, as described for adhesive layer 130 in FIGS. 3-5. In addition, adhesive layers 246 and 250 have good electrical conductivity and high thermal conductivity due to the graphene Cu core shells. Electrical components 244*b* and 244*c* can make electrical connection through bond wires 252, leadframe pads, adhesive layer 246, conductive layer 240, and conductive vias 230. Heat generated from leadframe module 256 is conducted through adhesive layers 246 and 250, conductive layer 234, and dissipated by heat sink 238.

An adhesive layer like 130 with graphene core shells such as 158 distributed in matrix 144 are useful for die attachment. Same is true for adhesive layers 170, 208, 246, and 250. The graphene core adhesive layer provides exceptional heat dissipation, shock absorption, and vibration dampening. The graphene core adhesive layer can be used in power applications, such as automotive, to support physical stress, vibration, temperature variation, high voltage, high power, and high frequency operation.

Figure 9A:
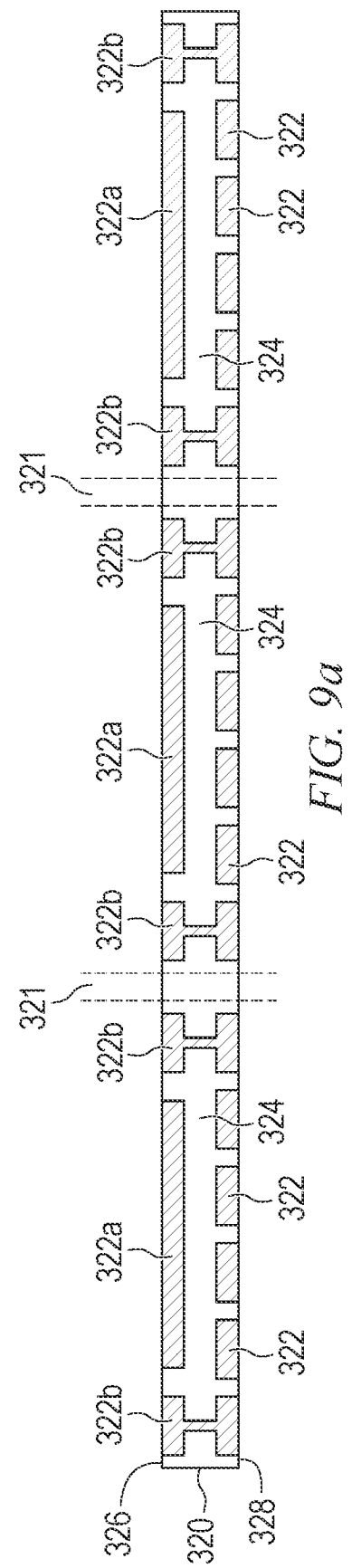
FIGS. 9a-9l illustrate another process of forming a semiconductor package with a graphene-based layer for die attach.

FIGS. 9*a*-9*l* illustrate another process of forming a semiconductor package with a graphene-based layer for die attach. FIG. 9*a* shows a cross-sectional view of multi-layered interconnect substrate 320 including conductive layers 322 and insulating layers 324. While only a single substrate 320 suitable to form three semiconductor packages separated by saw streets 321 is shown, hundreds or thousands of units are commonly manufactured and processed as part of a single substrate 320 before being singulated from each other, using the same steps described herein performed en masse. A separate substrate 320 could also be used for each unit being manufactured, the substrate being singulated before the steps shown in FIG. 9*a* and a plurality of individual substrates being placed on a common carrier for processing.

Conductive layer 322 can be one or more layers of Al, Cu, Sn, Ni, Au, Ag, or other suitable electrically conductive material. Conductive layers can be formed using PVD, CVD, electrolytic plating, electroless plating, or another suitable metal deposition process. Conductive layer 322 provides horizontal electrical interconnect across substrate 320 and vertical electrical interconnect between top surface 326 and bottom surface 328 of substrate 320. Portions of conductive layer 322 can be electrically common or electrically isolated depending on the design and function of the package being formed.

Insulating layer 324 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Insulating layer 324 provides physical support for, and electrical isolation between, conductive layers 322. Any number of conductive layers 322 and insulating layers 324 can be interleaved over each other to form substrate 320. Any other suitable type of package substrate or leadframe is used for substrate 320 in other embodiments.

Conductive layer 322 includes a plurality of contact pads formed over bottom surface 328 of substrate 320 for external interconnect of the final package. On top surface 326, conductive layer 322 includes a die pad 322a for mounting of a semiconductor die and a plurality of contact pads 322b for wire-bonding the semiconductor die to substrate 320. Contact pads 322b may also exist to surface-mount additional electrical components to top surface 326, e.g., discrete active or passive electrical components or additional semiconductor die. Die pad 322a has a footprint size and shape similar to a semiconductor die to be mounted, but may be slightly larger or smaller.

Figure 9B:
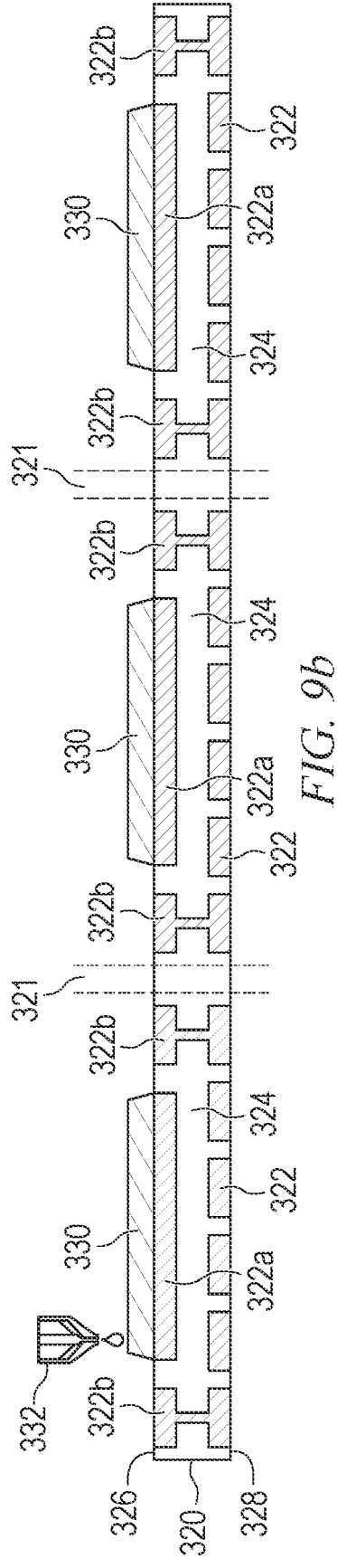

In FIG. 9b, a conductive material 330 is applied to die pads 322a. In some embodiments, conductive material 330 is a paste comprising graphene-coated silver, graphene-coated copper, or a combination of graphene-coated silver and graphene-coated copper. Conductive material 330 is deposited by aerosol jet printing a graphene-based conductive ink with dispenser 332, by electrohydrodynamic (EHD) jet printing, or by another suitable means. Die pads 322a can be completely covered with conductive material 330 or only partially covered.

Figure 9C:
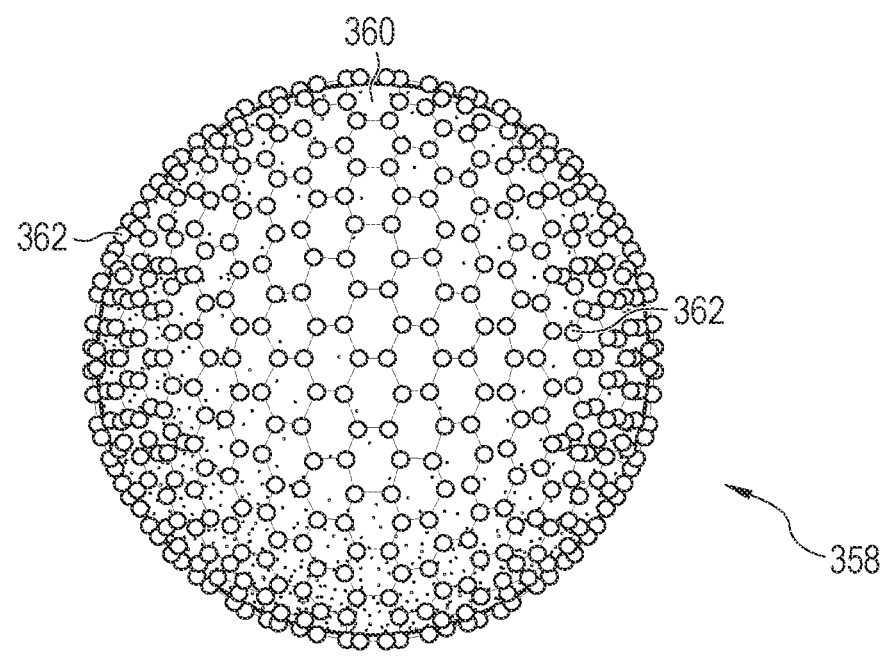

FIG. 9c illustrates detail of one of the graphene-coated metal balls 358 of conductive material 330. Graphene-coated metal balls 358 are formed of a core 360 and a graphene shell or coating 362 formed on and around the core. In one embodiment, core 360 is Cu, Ag, Ni, phase change material (PCM), or other suitable metal or similar material. In some embodiments, a mix of some Cu cores 360 and some Ag cores 360 are used. FIG. 9c illustrates detail of graphene shell 362 formed as a mesh network around core 360. Graphene shell 362 is an allotrope of carbon with one or more layers of carbon atoms each arranged in a two-dimensional (2D) honeycomb lattice. Graphene shell 362 can be formed by CVD, wet chemical synthesis, or other suitable means. A plurality of graphene coatings 362 is formed on each core 360 in some embodiments.

For CVD, core 360 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene shell 362 on core 360. The release of carbon atoms over core 360 forms a continuous sheet of graphene shell 362. Additional information related to forming graphene coating 362 is disclosed in U.S. Pat. Nos. 8,535,553, 10,421,123, Korean Patent No. KR101465616, and Korean Patent No. KR101895114, which are all incorporated herein by reference.

Figure 9D:
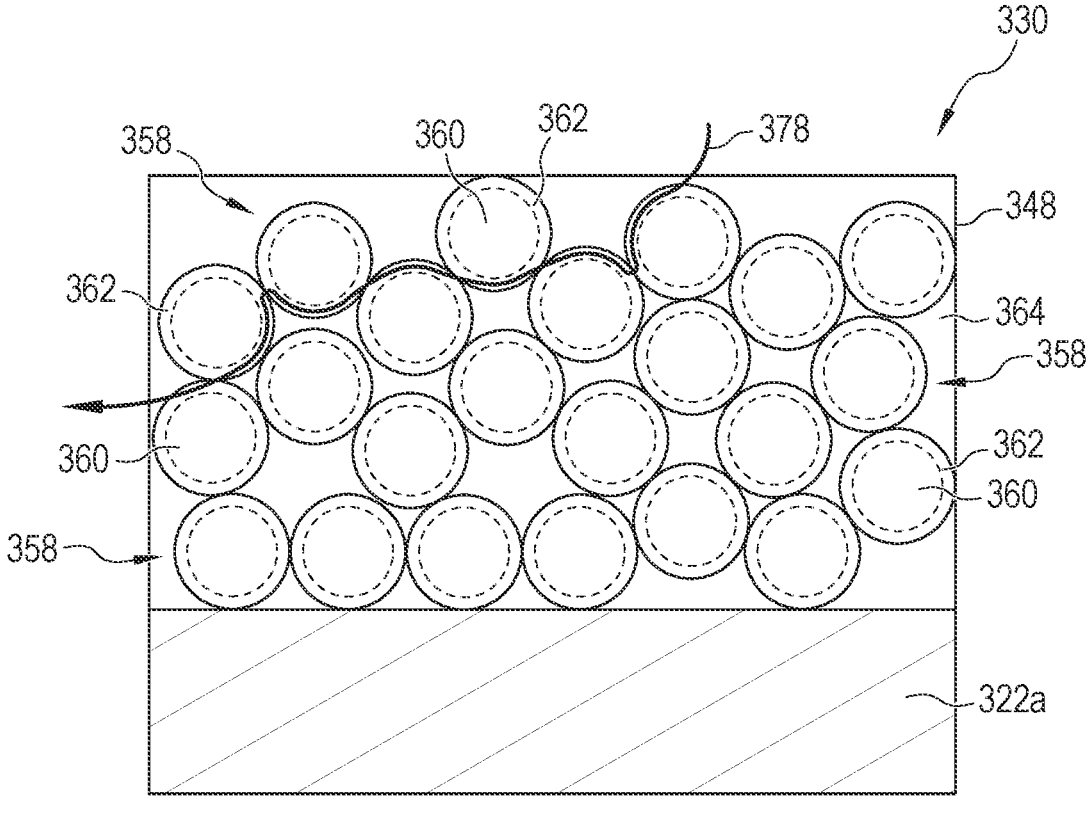

FIG. 9d shows further detail of conductive material 330 formed from a plurality of graphene-coated metal balls 358. In one embodiment, conductive material 330 includes matrix 364 and a plurality of cores 360 with graphene coating 362 embedded within the matrix. In one embodiment, matrix 364 is a thermoset material, such as epoxy resin or adhesive with binder and filler containing alumina, Al, aluminum zinc oxide, or other material having good conductive properties. Matrix 364 can be thermal grease such as silicon or polymer type, e.g., polymethyl methacrylate (PMMA) or polyethylene terephthalate (PET). Matrix 364 can be epoxy, polyester, or acryl in other embodiments. In another embodiment, matrix 364 is a polymer or composite epoxy with dispersed graphene, carbon nanotubes, conductive polymers, and the like. Conductive material 330 can be applied as an ink of graphene-coated metal balls 358 floating in matrix 364.

Each core 360, as embedded in matrix 364, is surrounded or covered by graphene coating or shell 362. In one embodiment, graphene shell 362 is a graphene paste or ink formed around a Cu or Ag core. In one embodiment, some cores 362 are formed from Cu while others are formed from Ag. Graphene coating 362 of each core 360 contacts the graphene coating of one or more adjacent cores. Cores 360 have sufficient density within matrix 364 that most if not all the graphene coatings around the cores contact at least one graphene coating around an adjacent core, and typically contact graphene coating of multiple adjacent cores.

Each graphene-coated metal ball 358 physically contacts adjacent graphene-coated metal balls within matrix 364 to create an electrically conductive path 378 including portions of interconnected graphene shells 362 on adjacent balls 358. The electrically conductive path 378 is the primary current carrier for conductive material 330. The electrical charges flowing through many electrically conductive paths like 378 in balls 358 operate to carry electrical signals.

Figures 9E, 9F:
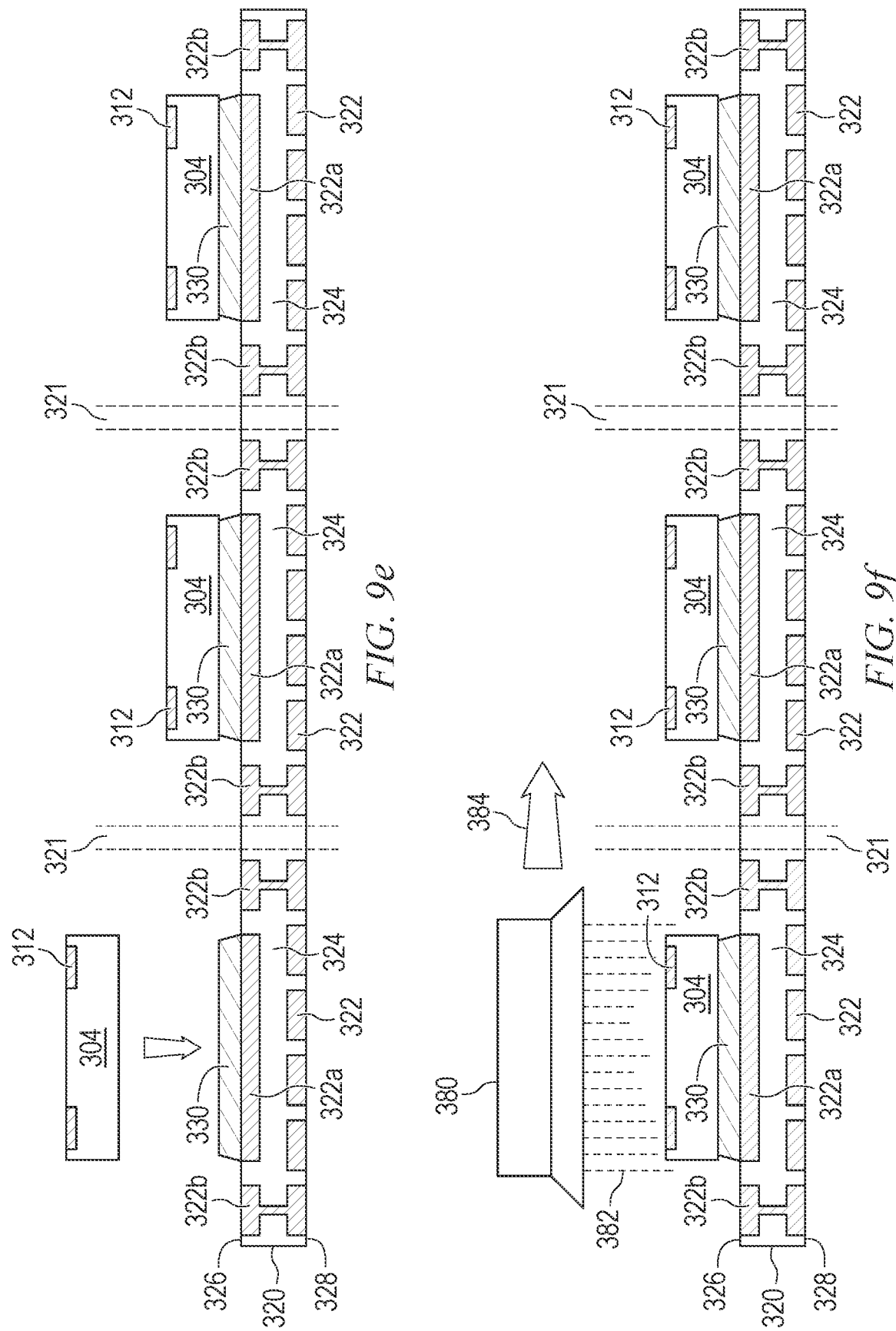

In FIG. 9e, semiconductor die 304 are disposed on die pads 322a with conductive material 330 between the die pads and semiconductor die. Semiconductor die 304 are the same as or similar to semiconductor die 104. Additional electrical components can be mounted on substrate 320 as well. For example, the electrical components can be discrete electrical devices, such as diodes, transistors, resistors, capacitors, and inductors, other semiconductor die, semiconductor packages, surface mount devices, RF components, and discrete electrical devices. Any number and type of electrical components can be mounted onto substrate 320.

Semiconductor die 304 are positioned over substrate 320 using a pick and place machine or operation, oriented with back surface 108 toward substrate 320, and brought into contact with conductive material 330. Conductive material 330 remains as a paste or other quasi-solid so that the shape of the conductive material conforms to the bottom of semiconductor die 304. The pick and place machine can press semiconductor die 304 into conductive material 304 such that the conductive material is displaced outside of the semiconductor die footprint and extends up side surfaces of the semiconductor die. In other embodiments, bottom surface 108 of semiconductor die 304 is only partially covered or completely covered. In embodiments where conductive material 330 is dispensed only partially covering die pad 322a, pressing semiconductor die 304 can spread out the conductive material so that a larger majority or an entirety of the die pad is covered.

With semiconductor die 304 in place on conductive material 330, conductive paths 378 established by graphene shells 362 electrically connect semiconductor die 304 to die pads 322a. In some embodiments, semiconductor die 304 is a vertically oriented die with, e.g., surface 110 being a diode cathode and surface 108 being the diode anode. In many other embodiments, back surface 108 is a contact or terminal for the die and one or more contacts are disposed as contact pads 312 on surface 110. Surface 108 can be electrically connected to surface 110 by conductive vias formed through semiconductor die 304 or by the semiconductor material itself.

To ensure mechanical stability of semiconductor die 304 on substrate 320 and establishment of conductive paths 378 between all adjacent balls 358, conductive material 330 is sintered as shown in FIG. 9f. Sintering is performed using infrared (IR) laser head 380 projecting laser emissions 382 onto active surface 110 of semiconductor die 304, in a process commonly referred to as laser-assisted bonding (LAB). IR laser emissions 382 heat up semiconductor die 304 directly, and the thermal energy is transmitted through the die to conductive material 330.

Laser head 380 is positioned so that IR laser emissions 382 impact the entirety of active surface 110 for one semiconductor die 304. Emissions 382 are emitted by laser head 380 to sinter conductive material 330 for that semiconductor die before the laser head is moved to the next die as indicated by arrow 384. Each semiconductor die 304 has its respective conductive material 330 sintered one at a time until all units are completed. In other embodiments, sintering can be completed as groups of any number of semiconductor die 304 at a time, including one embodiment where laser head 380 is large enough to sinter all units on substrate 320 at once.

Due to the nature of conductive material 330 being formed of graphene-coated balls 358, sintering with IR laser 380 takes only about thirty seconds or less, whereas prior art die attach with silver nanoparticles takes 30-90 minutes in an oven at between 150-500° C. Moreover, IR laser 380 is able to heat up only die 304, whereas the oven process heats up the entire substrate 320 and a volume of air around the devices.

An IPL irradiation process is used for sintering in other embodiments. IPL uses intense pulses of non-coherent light emitted over a range of wavelengths. In one embodiment, the IPL wavelength extends from approximately 350 nanometers (nm) to 3200 nm. A xenon flashlamp produces high output bursts of broad-spectrum light to perform IPL irradiation.

Figure 9G:
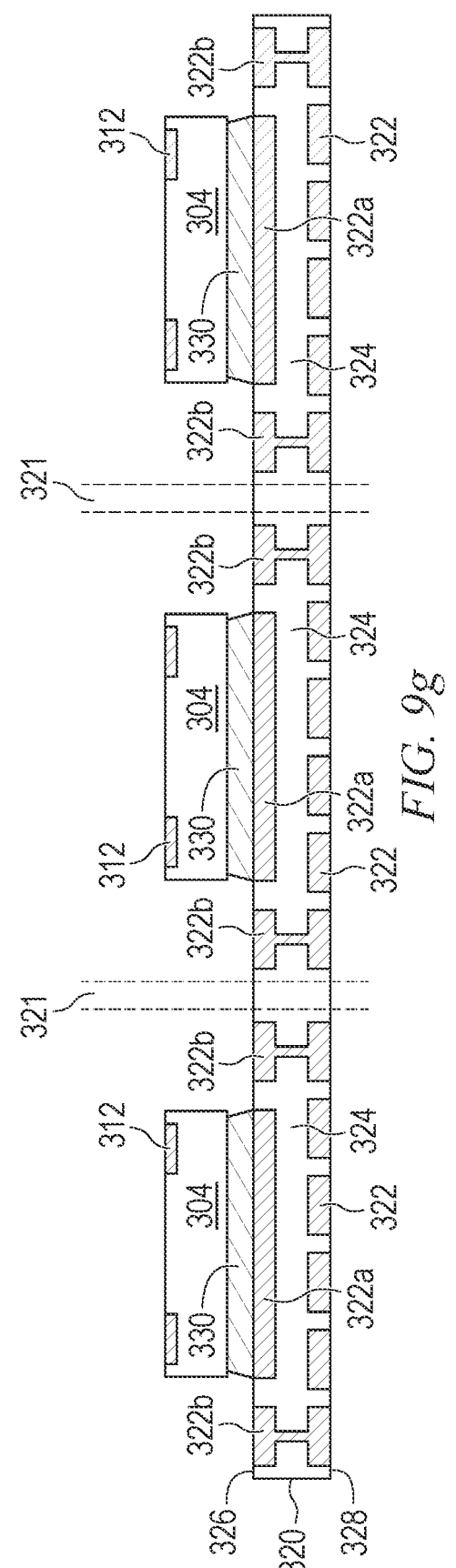

Sintering in FIG. 9f hardens conductive material 330 so that the conductive material provides a solid mechanical connection, in addition to the electrical connection, of semiconductor die 304 to substrate 320. FIG. 9g shows substrate 320 with semiconductor die 304 attached by conductive material 330.

Figure 9H:
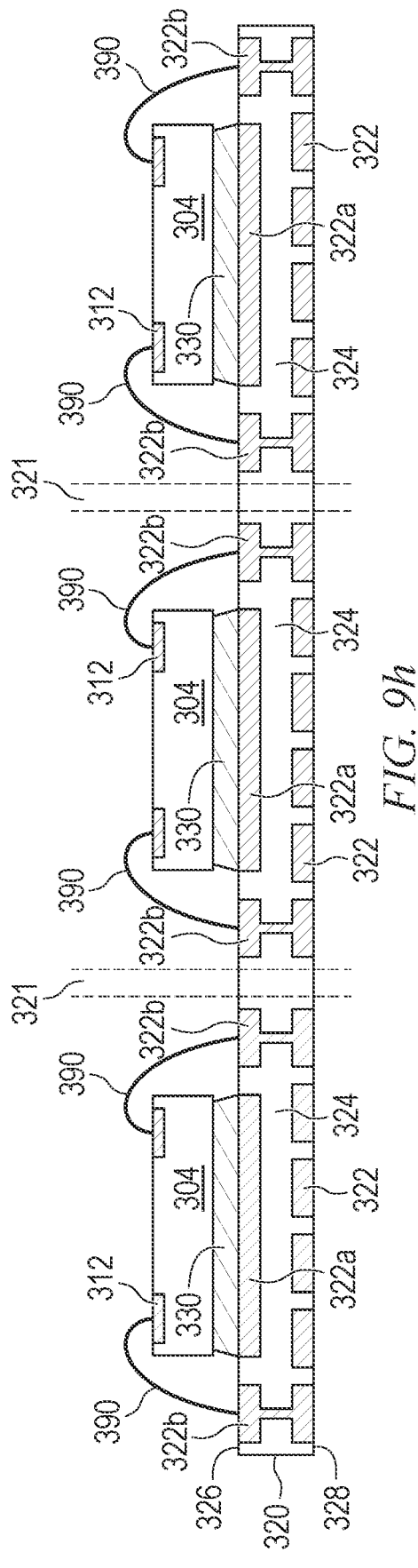

In FIG. 9h, bond wires 390 are formed electrically coupled between contact pads 312 of semiconductor die 304 and contact pads 322b on substrate 304. Bond wires 390 can be formed from copper, gold, aluminum, stainless steel, or another suitable conductive material using any suitable bond wire formation method.

Figures 9I, 9J:
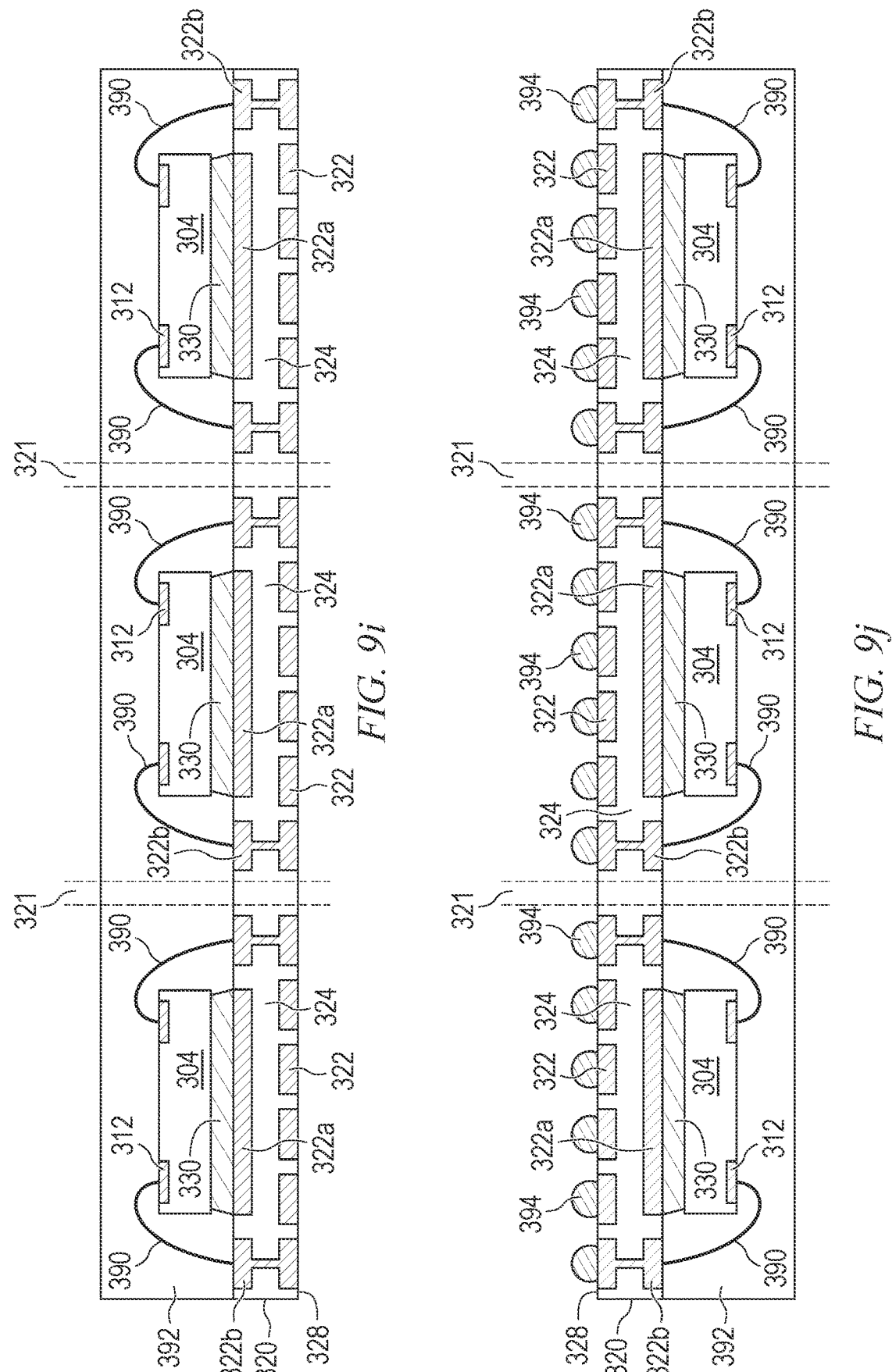

In FIG. 9i, encapsulant or molding compound 392 is deposited over and around substrate 320, semiconductor die 304, and bond wires 390 using a paste printing, compressive molding, transfer molding, liquid encapsulant molding, vacuum lamination, spin coating, or other suitable applicator. Encapsulant 392 can be liquid or granular polymer composite material, such as epoxy resin, epoxy acrylate, or another suitable polymer, with or without a suitable filler. Encapsulant 392 is non-conductive, provides structural support, and environmentally protects the semiconductor device from external elements and contaminants. In some embodiments where active surface 110 of semiconductor die 304 emits or is reactive to light, encapsulant 392 is transparent or translucent to allow light to pass through. In other embodiments, a transparent window or lens is embedded in an opaque encapsulant 392 to allow light to pass.

In FIG. 9j, the panel of devices is flipped so that bottom surface 328 of substrate 320 is oriented upward. An electrically conductive bump material is deposited over contact pads of conductive layer 322 on bottom surface 328 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 322 using a suitable attachment or bonding process. In one embodiment, the bump material is reflowed by heating the material above its melting point to form balls or bumps 394. In one embodiment, bump 394 is formed over an under-bump metallization (UBM) having a wetting layer, barrier layer, and adhesion layer. Bump 394 can also be compression bonded or thermocompression bonded to conductive layer 322. Bump 394 represents one type of interconnect structure that can be formed over conductive layer 322. The interconnect structure can also use bond wires, conductive paste, stud bump, micro bump, or other electrical interconnect. Contact pads of conductive layer 322 remain exposed as a land grid array in other embodiments.

Figures 9K, 9L:
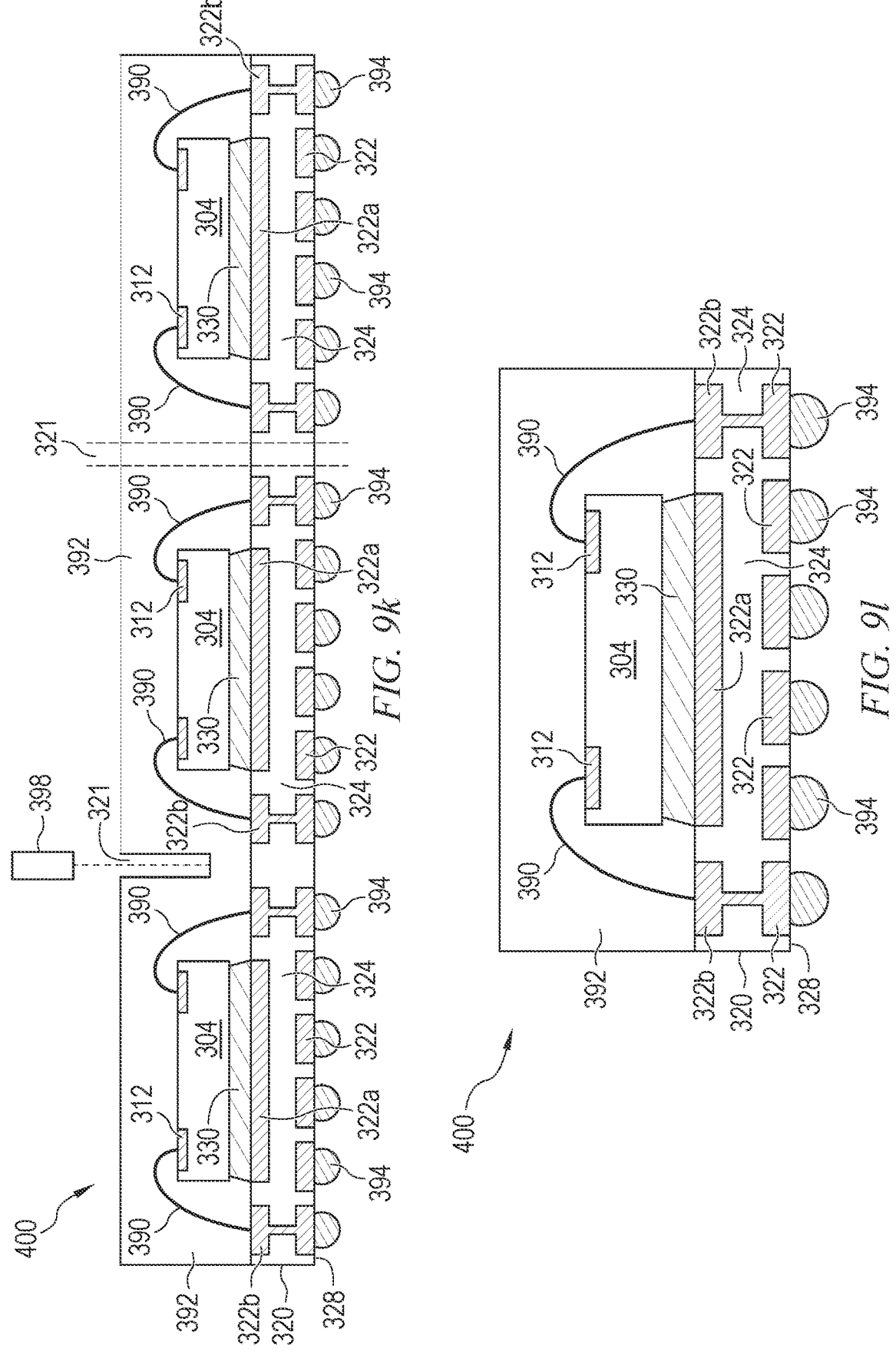

In FIG. 9k, encapsulant 392 and substrate 320 are singulated using a saw blade or laser cutting tool 398 to separate semiconductor die 304 into semiconductor packages 400. FIG. 9l shows a completed semiconductor package 400. Semiconductor die 304 is electrically coupled to bumps 394 by bond wires 390, conductive layer 322, and conductive material 330. Conductive material 330 is a graphene-based material, e.g., graphene-coated silver or copper balls 358. Graphene-coated balls 358 are a lower cost material compared to silver nanoparticles used in the prior art. Graphene-coating 362 reduces oxidation and ion migration, which improves reliability especially in substrates 320 with fine-pitched conductive traces in conductive layer 322. Graphene-based conductive material 330 can be sintered using laser-assisted bonding with IR laser 380 in a quicker process compared to oven baking typical conductive paste in the prior art, which improves the number of units per hour (UPH) that can be manufactured.

Figure 10A:
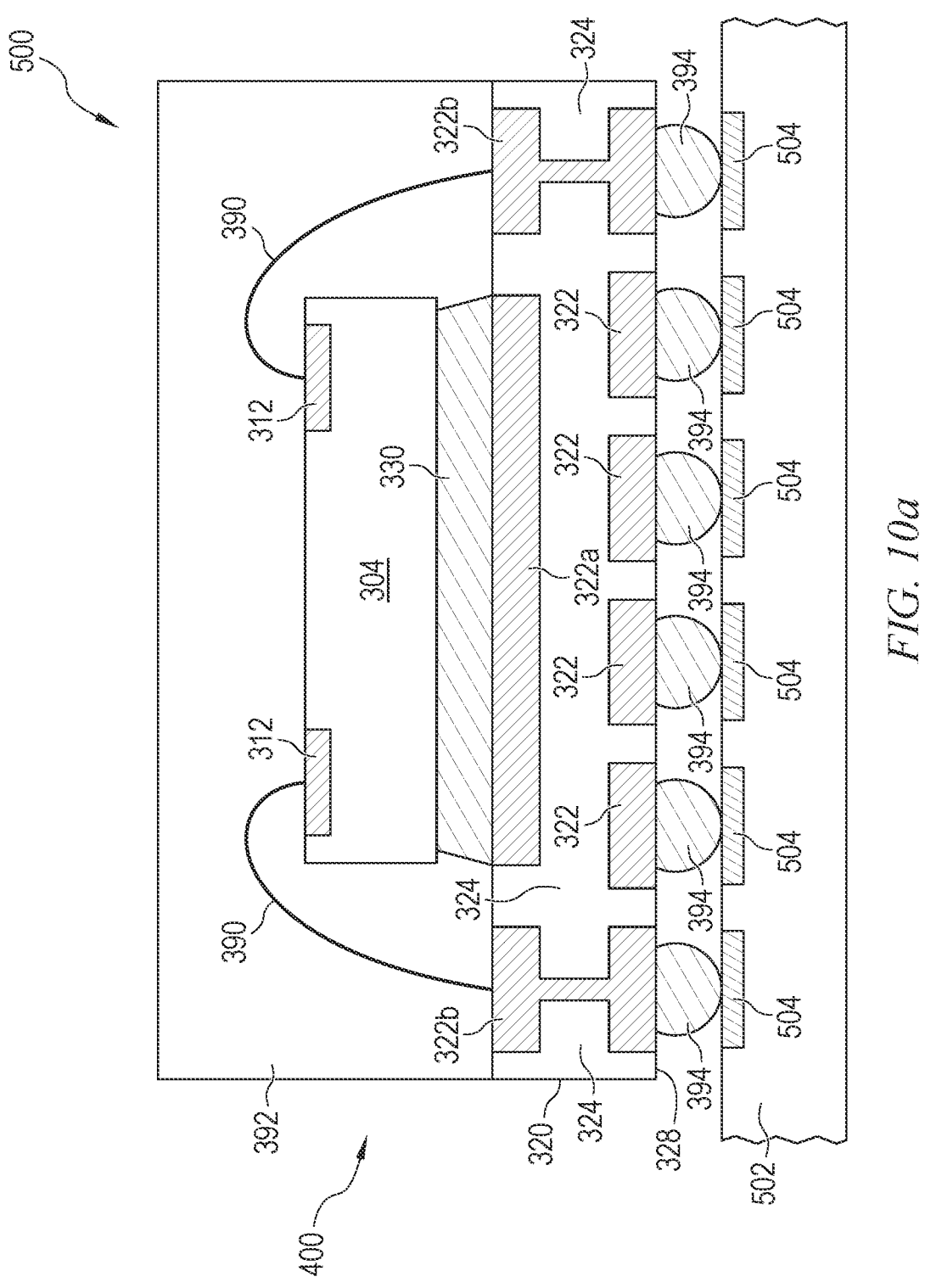
FIGS. 10a and 10b illustrate integrating the semiconductor package into an electronic device.
Figure 10B:
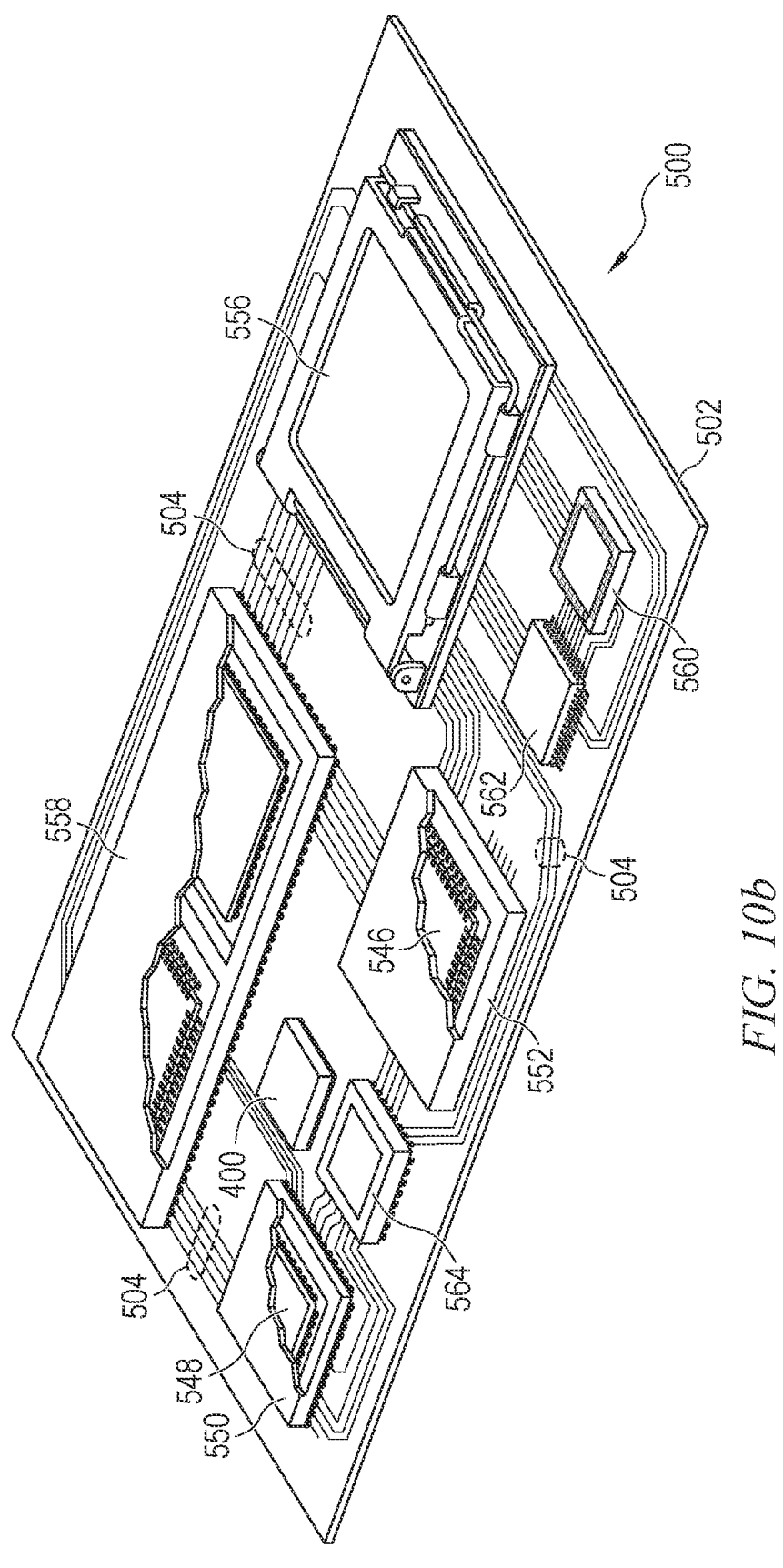

FIGS. 10a and 10b illustrate integrating the above-described semiconductor packages, e.g., semiconductor package 400, into a larger electronic device 500. FIG. 10a illustrates a partial cross-section of semiconductor package 400 mounted onto a printed circuit board (PCB) or other substrate 502 as part of electronic device 500. Bumps 394 are reflowed onto conductive layer 504 of PCB 502 to physically attach and electrically connect semiconductor package 400 to the PCB. In other embodiments, thermocompression or another suitable attachment and connection methods are used. In some embodiments, an adhesive or underfill layer is used between semiconductor package 400 and PCB 502. Semiconductor die 304 is electrically coupled to conductive layer 504 through bumps 394, substrate 320, bond wires 390, and conductive material 330.

FIG. 10b illustrates electronic device 500 having a chip carrier substrate or PCB 502 with a plurality of semiconductor packages disposed on a surface of PCB 502, including semiconductor package 400. Electronic device 500 can have one type of semiconductor package, or multiple types of semiconductor packages, depending on the application.

Electronic device 500 can be a stand-alone system that uses the semiconductor packages to perform one or more electrical functions. Alternatively, electronic device 500 can be a subcomponent of a larger system. For example, electronic device 500 can be part of a tablet, cellular phone, digital camera, communication system, or other electronic device. Alternatively, electronic device 500 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 502 may have a more irregular shape to fit conveniently into more ergonomic and smaller device shells.

In FIG. 10b, PCB 502 provides a general substrate for structural support and electrical interconnect of the semiconductor packages disposed on the PCB. Conductive signal traces 504 are formed over a surface or within layers of PCB 502 using evaporation, electrolytic plating, electroless plating, screen printing, or other suitable metal deposition process. Signal traces 504 provide for electrical communication between each of the semiconductor packages, mounted components, and other external system components. Traces 504 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 546 and flipchip 548, are shown on PCB 502. Additionally, several types of second level packaging, including ball grid array (BGA) 550, bump chip carrier (BCC) 552, land grid array (LGA) 556, multi-chip module (MCM) or SIP module 558, quad flat non-leaded package (QFN) 560, quad flat package 562, and embedded wafer level ball grid array (eWLB) 564 are shown disposed on PCB 502. In one embodiment, eWLB 564 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 502. In some embodiments, electronic device 500 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate including a die pad;

disposing a conductive material on the die pad, wherein the conductive material includes a plurality of graphene-coated metal balls in a matrix;

disposing a semiconductor die on the conductive material, wherein the graphene-coated metal balls are each interconnected as one graphene-coated metal ball of the plurality of graphene-coated metal balls physically contacts another graphene-coated metal ball of the plurality of graphene-coated metal balls within the conductive material to form a continuous thermal conduction path through the graphene-coated metal balls between the surface of the die pad and semiconductor die;

sintering the conductive material using an infrared laser;

forming a bond wire between the semiconductor die and substrate; and depositing an encapsulant over the semiconductor die and bond wire.

2. The method of claim 1, further including sintering the conductive material after disposing the semiconductor die on the conductive material.

3. The method of claim 1, further including sintering the conductive material for thirty seconds or less.

4. The method of claim 1, wherein the semiconductor die includes a light emitting diode.

5. The method of claim 1, further including forming a solder bump on the substrate opposite the semiconductor die.

6. The method of claim 1, further including depositing the conductive material by jet printing.

7. A method of making a semiconductor device, comprising:

providing a substrate;

disposing a conductive material over the substrate, wherein the conductive material includes a plurality of graphene-coated metal balls; and disposing a semiconductor die over the conductive material, wherein the graphene-coated metal balls are each interconnected as one graphene-coated metal ball of the plurality of graphene-coated metal balls physically contacts another graphene-coated metal ball of the plurality of graphene-coated metal balls within the conductive material to form a continuous thermal conduction path through the graphene-coated metal balls between the surface of the die pad and semiconductor die.

8. The method of claim 7, further including sintering the conductive material using an infrared laser.

9. The method of claim 8, further including sintering the conductive material after disposing the semiconductor die over the conductive material.

10. The method of claim 8, further including sintering the conductive material for thirty seconds or less.

11. The method of claim 7, wherein the semiconductor die includes a light emitting diode.

12. The method of claim 7, further including forming a solder bump on the substrate opposite the semiconductor die.

13. The method of claim 7, further including depositing the conductive material by jet printing.

14. A method of making a semiconductor device, comprising:

providing a substrate including a die pad;

disposing a conductive material on the die pad, wherein the conductive material includes a plurality of graphene-coated metal balls in a matrix;

disposing a semiconductor die on the conductive material, wherein the graphene-coated metal balls are each interconnected as one graphene-coated metal ball of the plurality of graphene-coated metal balls physically contacts another graphene-coated metal ball of the plurality of graphene-coated metal balls within the conductive material to form a continuous thermal conduction path through the graphene-coated metal balls between the surface of the die pad and semiconductor die;

sintering the conductive material using an infrared laser; and depositing an encapsulant over the semiconductor die.

15. The method of claim 14, further including sintering the conductive material after disposing the semiconductor die on the conductive material.

16. The method of claim 14, further including sintering the conductive material for thirty seconds or less.

17. The method of claim 14, wherein the semiconductor die includes a light emitting diode.

18. The method of claim 14, further including forming a solder bump on the substrate opposite the semiconductor die.

19. The method of claim 14, further including depositing the conductive material by jet printing.

20. A method of making a semiconductor device, comprising:

providing a substrate;

disposing a conductive material over the substrate, wherein the conductive material includes a plurality of graphene-coated metal balls; and disposing a first semiconductor die over the conductive material, wherein the graphene-coated metal balls are each interconnected as one graphene-coated metal ball of the plurality of graphene-coated metal balls physically contacts another graphene-coated metal ball of the plurality of graphene-coated metal balls within the conductive material to form a continuous thermal conduction path through the graphene-coated metal balls between the surface of the die pad and first semiconductor die.

21. The method of claim 20, further including sintering the conductive material using an infrared laser.

22. The method of claim 21, further including sintering the conductive material after disposing the first semiconductor die over the conductive material.

23. The method of claim 21, further including sintering the conductive material for thirty seconds or less.

24. The method of claim 20, wherein the first semiconductor die includes a light emitting diode.

25. The method of claim 20, further including:

disposing a second semiconductor die over the conductive material; and forming a bond wire extending from the first semiconductor die to the second semiconductor die.

* * * * *